(12) United States Patent
Takahashi et al.

(10) Patent No.: US 6,646,956 B2
(45) Date of Patent: Nov. 11, 2003

(54) ONE-SHOT SIGNAL GENERATING CIRCUIT

(75) Inventors: Hiroyuki Takahashi, Tokyo (JP); Hideo Inaba, Tokyo (JP); Masatoshi Sonoda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/221,249

(22) PCT Filed: Mar. 7, 2001

(86) PCT No.: PCT/JP01/01769
§ 371 (c)(1),
(2), (4) Date: Sep. 10, 2002

(87) PCT Pub. No.: WO01/69606
PCT Pub. Date: Sep. 20, 2001

(65) Prior Publication Data
US 2003/0090954 A1 May 15, 2003

(30) Foreign Application Priority Data

Mar. 13, 2000 (JP) .......................... 2000-69171
Feb. 22, 2001 (JP) .......................... 2001-47215

(51) Int. Cl.$^7$ ................................ G11C 8/00
(52) U.S. Cl. ..................... 365/233.5; 365/189.11; 365/233
(58) Field of Search ......................... 365/233.5, 233, 365/236, 189.11, 189.09, 241, 230.08

(56) References Cited

U.S. PATENT DOCUMENTS 5,943,281 A * 8/1999 Izumi ...................... 365/225.7
6,016,284 A    1/2000 Itagaki et al. ............. 365/233.5
6,144,613 A * 11/2000 Matsubara ................. 365/233
6,188,639 B1 * 2/2001 Sakakibara ............... 365/233

FOREIGN PATENT DOCUMENTS

| JP | 5-196757  | 8/1993  |
| JP | 6-251585  | 9/1994  |
| JP | 7-36770   | 2/1995  |
| JP | 8-222000  | 8/1996  |
| JP | 9-200009  | 7/1997  |
| JP | 11-283371 | 10/1999 |

* cited by examiner

Primary Examiner—Richard Elms
Assistant Examiner—Hien Nguyen
(74) Attorney, Agent, or Firm—Choate, Hall & Stewart

(57) ABSTRACT

A one-shot signal generation circuit is provided which makes it easy to adjust pulse width and to deal with variation of skew of an ATD signal, and can reduce chip area. A timing determination section (100) is reset by an edge of a first detected signal among a plurality of address transition detection signals (ATD signals) which have arrived within the skew period of an address signal, measures a first predetermined time by taking an edge of a second detected signal as start instant, and outputs a signal DST which reflects the result of this measurement. A timing determination section (110) measures a second predetermined time by taking an edge of the first detected signal as start instant, and outputs a signal PG which reflects the result of this measurement. An LC generation circuit (14) outputs a one-shot signal (LC) whose start instant is determined by the signal PG and whose end instant is determined by the signal DST.

11 Claims, 16 Drawing Sheets

74 (75,76);FREQUENCY DIVISION CIRCUIT

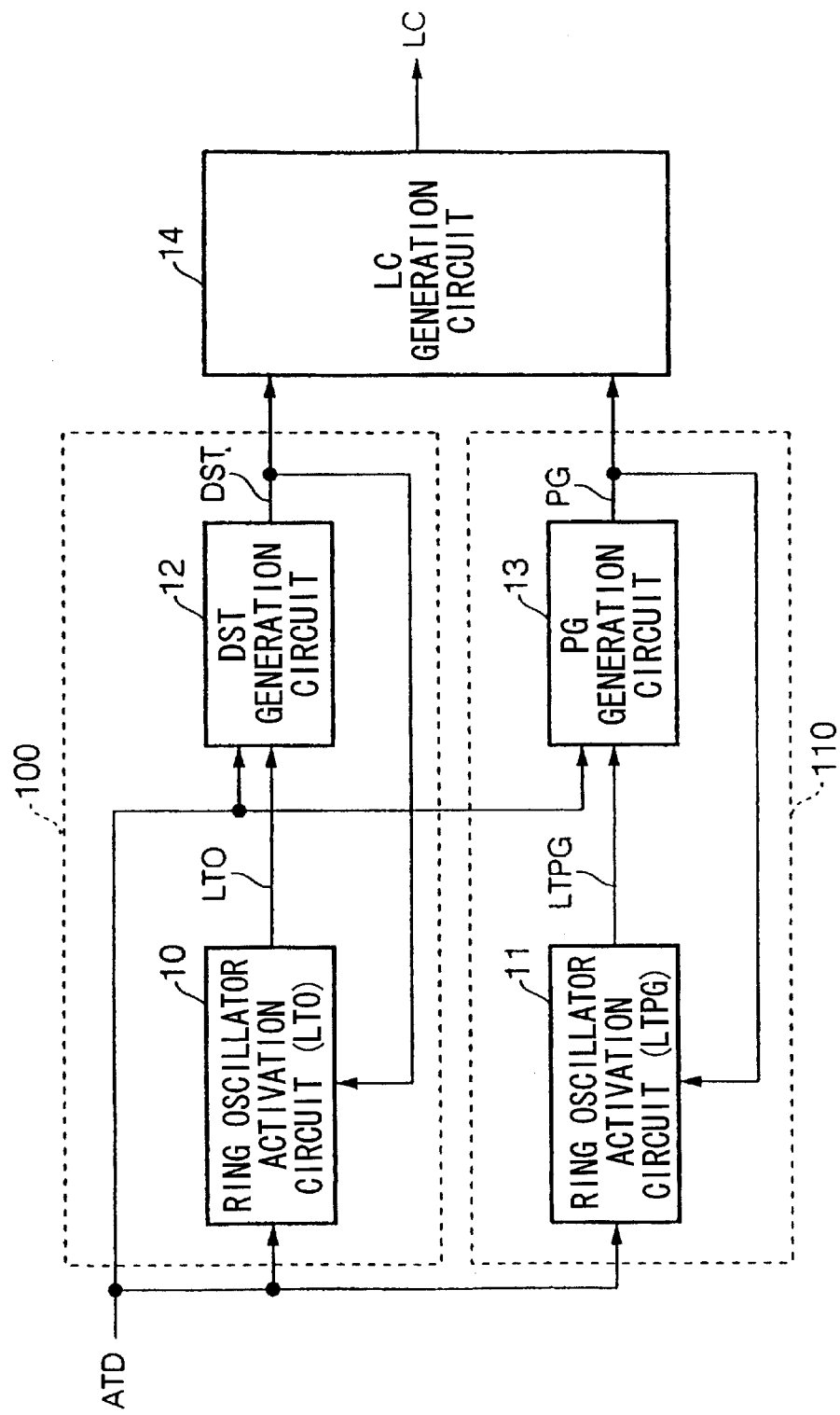

ONE-SHOT SIGNAL GENERATING CIRCUIT

TECHNICAL FIELD

This invention relates to a one-shot signal generation circuit which generates a one-shot signal for determining the internal operational timing of an asynchronous memory.

BACKGROUND ART

As a conventional asynchronous memory, there has been a memory which operates by generating a one-shot signal internally when an external address has changed. As a one-shot signal generation circuit for generating this one-shot signal, generally a circuit as shown in FIG. 19 is employed. The one-shot signal generation circuit shown in this figure detects change (transition) of address signals A0–AX which are its input signals, generates a plurality of address transition detection signals (hereinafter termed ATD signals) in pulse form, and combines these ATD signals into a single one-shot signal. Various internal signals for providing timing for internal operations, such as latch signals for latching addresses, are generated from the one-shot signal which has been generated in this manner.

The structure of a one-shot signal generation circuit according to the background art will be explained in the following in concrete terms. In FIG. 19, the reference symbols 5-0 to 5-X denote address transition detection circuits (ATD0–ATDX). These address transition detection circuits 5-0 to 5-X detect transitions of address signals A0–AX, and generate ATD signals having pulse widths greater than the skew widths which these address signals A0–AX have. The reference symbol 6 denotes a NOR gate (a negative logical sum gate circuit). This NOR gate 6 combines the plurality of ATD signal output from the address transition detection circuits 5-0 to 5-X into a single signal S6 (a pulse signal).

The reference symbol 7 denotes a predetermined number (an odd number) of inverter gates connected together as a cascade, and the reference symbol 8 is a NOR gate. In this example, the inverter gates 7 and the NOR gate 8 constitute an edge detection circuit which detects the low edge of the output signal S6 of the NOR gate 6, and, when the low edge is input, a one-shot signal S8 is output which has a pulse width corresponding to the delay time of the inverter gates 7. These inverter gates 7 and the NOR gate 8 function as a timing adjustment circuit for adjusting the timing of the output signal of the NOR gate 6, and they adjust the pulse width of the one-shot signal which is output from the NOR gate 6 to a pulse width which corresponds to the delay time provided by the inverter gates 7.

According to this background art circuit structure, after the arriving address signals A0, A1 . . . , AX which have skew have been subjected by the address transition detection circuits (ATD0–ATDX) 5-0, 5-1 to 5-X to waveform shaping into ATD signals (the output signals of the address transition detection circuits 5-0 to 5-X) which have pulse widths greater than the skew widths of the address signals, these signals are combined by the NOR gate 6 into a single signal. Accordingly, the output signal of this NOR gate 6 has a pulse width greater than the skew widths of the address signals A0, A1–AX. The timing adjustment circuit which is made up from the inverter gates 7 and the NOR gate 8 adjusts the timing of the output signal of the NOR gate 6, and generates the one-shot signal S8 which has a predetermined pulse width.

FIG. 20 shows the address transition detection circuit (ATD0) 5-0. The structures of the other address transition detection circuits (ATD1–ATDX) 5-1 to 5-X are the same as that shown in FIG. 20.

In FIG. 20, the reference symbol 170 denotes a delay circuit, the reference symbol 171 denotes an inverter, and the reference symbols 173, 174, and 175 denote NAND gates (negative logical product gates). Here, along with the input signal (the address signal A0) being delayed by the delay circuit 170 and becoming one of the input signals to the NAND gate 173, also it is inverted by the inverter 171 and, in the same manner, becomes the other input signal to the NAND gate 173. The delay circuit 170, inverter 171, and NAND gate 173 constitute a circuit system which detects the fact that the input signal has undergone a transition from high level to low level.

Furthermore, along with the input signal (the address signal A0) being delayed by the delay circuit 170 and becoming one of the input signals to the NAND gate 174, also it becomes the other input signal to this NAND gate 173. This delay circuit 170 and NAND gate 174 constitute a circuit system which detects the fact that the input signal has undergone a transition from low level to high level. The NAND gate 175 combines the pulse signals output from the NAND gate 173 and the NAND gate 174 into a single signal. In this example, when the input signal has undergone a transition, one or the other of the NAND gate 173 and the NAND gate 174 outputs a pulse signal at low level, according to the direction of this transition. The NAND gate 175 receives these pulse signals and outputs the ATD signal. The pulse width of this ATD signal is determined by the delay time of the delay circuit 170.

For the delay circuit 170 which is used in the address transition detection circuit, there are the circuit type shown in FIG. 21 and the circuit type shown in FIG. 22. The circuit type of FIG. 21 is a delay circuit in which a plurality of inverter gates 180 are connected as a cascade, and it provides the desired delay time by accumulating the operational delay time of each of the inverters. Furthermore, the circuit type of FIG. 22 is a delay circuit in which a capacitor 191 is connected to each stage of inverter gates 190 which are connected as a cascade, and it provides the desired delay time by delaying the output signals of the respective inverters with the capacitors 191. The delay time of this delay circuit 170 is set to a value which is greater than the skew width of the address signal.

As has been explained above, according to the background art, since the pulse widths of the ATD signals which are respectively output from the address transition detection circuits 5-0, 5-1 to 5-X are greater than the skews of the address signals A0, A1–AX, the one-shot signal which is output from the NOR gate 8 is not separated into a plurality of pulse signals even due to the input of address signals A0, A1–AX which arrive having skew, but is generated as a single pulse signal.

However, with the address transition detection circuits according to the background art, problems occur like the following due to the use of various types of delay circuit such as the delay circuit 170 for determining the pulse width of the ATD signal and the inverter gates 7 for timing adjustment and so on.

(1) Increase of Current Consumption by the Delay Circuit

Among the circuit systems for the delay circuit 170 which makes up the address transition detection circuit, according to the circuit system shown in FIG. 21, a large number of inverter gates of high drive power connected in a cascade are required for each of a plurality of ATD signals (for each address transition detection circuit). Accordingly, with this circuit system, there are the problems that the occupancy area upon the chip becomes large, and moreover the power consumption is increased by the activation of the large number of inverter gates of high drive power.

(2) Variation in the Delay Time of the Delay Circuit

The circuit system shown in FIG. 22 is made by connecting inverter gates whose drive power is small in a cascade, and it generates its delay time by driving each of capacitors with each of the inverter gates. Here, variations in the drive power of the inverter gates come to exert a great influence upon the delay time when the number of stages of the inverter gates is increased, since the amounts of variation in the drive power of the inverter gates are superposed. Furthermore, the smaller are the transistors in gate width and gate length, the more does the accuracy of alignment of the mask for the manufacturing process greatly influence their electrical characteristics.

Due to this, when for example low drive power inverter gates are made using transistors which have small gate width, and a large number of stages of these inverter gates are connected together to form a delay circuit, by comparison to the case in which transistors of large drive power are used, variations in the drive power of the inverter gates (the current drive power of the transistors) come to exert a great influence upon the delay time (the charge and discharge time). Accordingly, with this circuit system, it becomes easy for the delay time of the inverter gates which are connected in a cascade to suffer the influence of production deviations, and the problem arises that it becomes difficult to obtain an accurate delay time.

(3) Breakup of the Pulse Signal Due to Skew of the Input Signal

When, due to variations in the current drive power of the transistors, the delay time of the delay circuit 170 which constitutes each of the address transition detection circuits varies so as to become shorter, it becomes impossible to combine the ATD signals which are output from the address transition detection circuits into a single pulse signal with the NOR gate 6, due to the amount of skew included in input signals, and it may happen that a plurality of pulse signals are output from the NOR gate 6. In this manner, when the pulse signal which is output from the NOR gate 6 is divided into a plurality thereof, it becomes impossible to generate a proper one-shot signal.

(4) Variation of the Pulse Width Due to Reduction of the Period of the Input Signal With the structure shown in FIG. 19, if for example the period of the address signal A0 is short, the phenomenon occurs that the pulse width of the pulse signal which is output from the NOR gate 8 becomes narrower than the proper pulse width. With regard to this phenomenon, the case in which the address signal A0 changes over will be explained with reference to the waveform shown in FIG. 23 in concrete terms as an example.

First, the correct operation will be explained. Now, when the address signal A0 changes over at the time t1 shown in FIG. 23, the address transition detection circuit 5-0 detects this signal transition and outputs an ATD signal. The NOR gate 6 receives this ATD signal and outputs a signal S6. In other words, the signal S6 is changed over to low level in response to the change in the address signal A0, and after a fixed time it returns back to high level. The signal S8 which is output from the NOR gate 8 changes to high level upon receipt of the change in the signal S6. On the other hand, the signal S6 is delayed by the inverter gates 7 to become the signal S7, and the signal S7 changes to high level after a predetermined time from when the signal S6 changes. Due to this, the signal S8 which is output from the NOR gate 8 returns to low level. In summary, when the address signal A0 changes over, a signal S8 having a pulse width corresponding to the delay time of the inverter gates 7 is correctly generated.

Next, the operation (improper operation) in the case that the address signal A0 changes over at the time t2 shown in FIG. 23, and the address period Tadd has become short, will be explained.

In this case, in the same way as with the case described above, the signal S6 changes to low level upon receipt of the change of the address signal A0. Here, according to proper operation, as shown by the dotted line in FIG. 23, the signal S8 would change to high level in response to change of the signal S6. However, since in the previous cycle the low level of the signal S6 was delayed by the delay circuit 170 and is reflected in the signal level of the signal S7, even if the cycle changes over, the signal S7 is maintained at high level for a certain period. Due to this, the signal S8 does not respond to the signal S6, and comes to be at high level upon receipt of the signal S7. Accordingly, in this case, the rising slope of the pulse of the signal S8 is delayed, and the pulse width of the signal S8 becomes narrow. In this manner, according to the structure shown in FIG. 19, when the period of the address signal becomes short, the problem arises that the pulse width becomes narrow.

(5) Variation of the Pulse Width Due to Short Pulse Input Signals

With the structure shown in FIG. 19, if for example a short pulse SP occurs in the address signal A0, this short pulse appears unchanged in the output, and the phenomenon occurs that the pulse width of the pulse signal which is output from the NOR gate 8 becomes narrower than the proper pulse width. With regard to this phenomenon, the case in which a short pulse has occurred in the address signal A0 will be explained with reference to the waveform shown in FIG. 24 in concrete terms as an example.

Now, when the address signal A0 is at low level, and a short pulse SP of high level occurs in this address signal A0, this short pulse SP is output through the NAND gate 174 and the NAND gate 175 as the signal S175. In other words, the position of the edge of the short pulse which appears in the signal S175 is determined according to the edge of the short pulse SP in the address signal A0. Here, with proper operation, as shown by the dotted lines in FIG. 24, the falling edge of the signal S175 is determined by receipt of change of the signal S170 which has been delayed by the delay circuit 170. However, since the address signal A0 changes to low level before this, the signal S175 does not respond to the signal S170, and returns to low level in response to the address signal A0. As a result, the pulse width of the signal S175 is narrower than the proper pulse width that is required.

As has been explained above, according to the background art described above, since the pulse width of the one-shot signal is determined using a delay circuit, the pulse width of the one-shot signal easily suffers influences from variations in the delay time of the delay circuit, skew of the input signals, variations in the period of the input signals, short pulses occurring in the input signals, and the like, so that it is not possible to generate the one-shot signal stably.

DISCLOSURE OF INVENTION

The present invention was conceived against this type of background, and its objective is to provide a one-shot signal generation circuit with which, by providing, for example, ring oscillators and a plurality of frequency division circuits connected in a cascade, adjustment of the pulse width and countermeasures against variation of the skew of the ATD signals becomes easy, so that it is capable of stably generating a one-shot signal.

The one-shot signal generation circuit according to the first aspect of the present invention comprises a first timing adjustment circuit (for example, a structural element which corresponds to a timing determination section 100 which will be described hereinafter) which is reset by a first edge of a plurality of address transition detection signals (for example, an element which corresponds to an ATD signal output by an address transition detection circuit 3 which will be described hereinafter) which have arrived within a skew period, and takes a second edge of the address transition detection signals as start instant and measures a first predetermined time.

The one-shot signal generation circuit according to the second aspect of the present invention comprises a second timing adjustment circuit (for example, a structural element which corresponds to a timing determination section 110 which will be described hereinafter) which takes a first edge of the initial address transition detection signal among a plurality of address transition detection signals which have arrived within a skew period as start instant and measures a second predetermined time.

The one-shot signal generation circuit according to the third aspect of the present invention comprises, in addition to the structure of the one-shot signal generation circuits according to the first and the second aspects, a generation section (for example, a structural element which corresponds to functions of an LC generation section 14 which will be described hereinafter) which outputs a pulse by taking as start instant the time point at which the second predetermined time has elapsed, and taking as end instant the time point at which the first predetermined time has elapsed for the last address transition detection signal among the plurality of address transition detection signals.

In the one-shot signal generation circuit according to any one of the first through third aspects, each timing adjustment circuit may, for example, be made up by one or more frequency division circuits connected in a cascade. In this case, in each timing adjustment circuit, there may be provided a preparatory circuit (for example, a structural element which corresponds to inverter chains 90 and 150 which will be described hereinafter) which performs fine timing adjustment of the frequency division circuits at the previous stage of the frequency division circuits which are connected in a cascade. Or, in each timing adjustment circuit, there may be provided a preparatory circuit (for example, a structural element which corresponds to a circuit made up from a NAND 111 and a NOR 112 which will be described hereinafter) which performs fine timing adjustment of the frequency division circuits at the next stage of the frequency division circuits which are connected in a cascade. And the preparatory circuit may, for example, be made up of a predetermined number of inverter gates connected in a cascade.

Furthermore, in the one-shot signal generation circuit according to any one of the first through third aspects, each predetermined time may desirably be greater than or equal to the skew period of the address detection signals. Furthermore, for example, a logical sum signal (for example, an element which corresponds to an ATD signal output by an address transition detection circuit 3 which will be described hereinafter) of the plurality of address transition detection signals which have arrived within the skew period may be input to each timing adjustment circuit.

The one-shot signal generation circuit according to the fourth aspect of the present invention generates a one-shot signal in response to change of an input signal, and comprises a signal transition detection section (for example, a structural element which corresponds to an address transition detection circuit 3 which will be described hereinafter) which detects transition of the input signal and generates a pulse signal; and a timing determination section (for example, a structural element which corresponds to timing determination sections 100 and 110 which will be described hereinafter) which detects an edge of the pulse signal, starts a count by taking the edge as a trigger, and determines the timing of edges of the one-shot signal based upon the count value.

In the one-shot signal generation circuit according to the fourth aspect, the timing determination section may desirably determine the edge of the one-shot signal based upon the count value by taking the start edge of the initial pulse signal as a trigger. Furthermore, the timing determination section may, for example, comprise a flip-flop whose stability state is inverted in response to the pulse signal as a trigger, and a counter which starts a count in response to the output signal of the flip-flop as a trigger, and initializes the stability state of the flip-flop based upon the count value of the counter. Furthermore, the counter may, for example, reset the count value based upon the pulse signal. Moreover, for example, the counter may prohibit the resetting of the counter value due to the pulse signal based upon the output signal of the flip-flop.

The one-shot signal generation circuit according to the fifth aspect of the present invention generates a one-shot signal in response to change of an input signal, and comprises: a signal transition detection section which detects transition of the input signal and generates a pulse signal; a timing determination section which, along with detecting a start edge of the pulse signal which is output from the signal transition detection section, starting a count by in response to the start edge as a trigger, and determining the timing of edges of the one-shot signal based upon the count value, and detects an end edge of the pulse signal which is output from the signal transition detection section, starts a count in response to the end edge as a trigger, and determines the timing of an end edge of the one-shot signal based upon the count value; and a signal generation section which generates a one-shot signal having edges whose timing is determined by the timing determination section.

In the one-shot signal generation circuit according to the fourth or fifth aspect, the signal transition detection section, for example, may comprise a plurality of address transition detection circuits which detect transition of a plurality of address signals as the input signal; and a logic gate which combines pulse signals which are respectively output from the plurality of address transition detection circuits into a single signal.

By doing as described above, the present invention can utilize a structure in which the pulse width of the one-shot signal is adjusted not by separate delay circuits, but for example by a single delay circuit and frequency division circuit, and resets the frequency division circuits with the respective address transition detection signals. As a result, it is possible to determine the generation timing and termination timing of the one-shot signal according to a pulse of suitable timing even when the address transition detection signal has been divided into a plurality thereof. Furthermore, it is possible to bring the adjustment points for timing into a single point, so that it is possible to perform reduction of the chip area. Moreover, it is possible to attain the objects

BRIEF DESCRIPTION OF DRAWINGS

FIG. 10 is a block diagram showing the structure of a one-shot signal generation circuit according to the third embodiment of the present invention.

BEST MODE FOR CARRYING OUT THE INVENTION

In the following, embodiments of the present invention will be explained with reference to the drawings.

<Embodiment 1>

Figure 1:
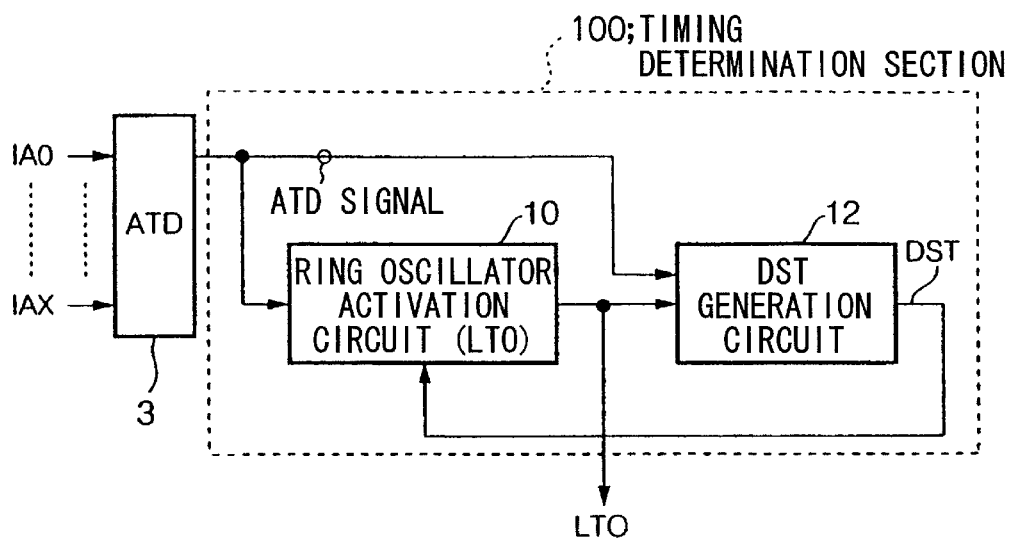
FIG. 1 is a block diagram showing the structure of a timing determination section according to the first embodiment of the present invention.

FIG. 1 shows the structure of a one-shot signal generation circuit according to the first embodiment of the present invention. This one-shot signal generation circuit is used in an asynchronous memory, and it generates a one-shot signal LTO for determining an internal operational timing in response to a change in input signals such as address signals.

In this figure, the reference symbol 3 denotes an address transition detection circuit (ATD; Address Transition Detector) which detects transition of an address signal IA0–IAX (input signals) and generates an ATD signal (a pulse signal). In this first embodiment, the edge of the ATD signal has a more important meaning than its pulse width. In other words, the pulse width of the ATD signal which is generated by the address transition detection circuit 3 may be narrow provided that at least the arrival of its rising edge and its falling edge are significant, so that it will be sufficient for it to be set so that its edges arrive sharply.

The reference symbol 100 denotes a timing determination section which, along with functioning as a circuit section for generating a one-shot signal LTO, determines the timing of the edge of the one-shot signal LTO. This timing determination section 100 is made up from a ring oscillator activation circuit 10 and a DST generation circuit 12, and it is triggered to start its count by the edge of an ATD signal which is output from the address transition detection circuit 3, and determines the timing of the edge of the one-shot signal LTO based upon this count value.

Here, the ring oscillator activation circuit 10 controls the activation state of a ring oscillator which will be described hereinafter which constitutes the DST generation circuit 12, and principally it is structured as a flip-flop, with the stable state of this flip-flop being reversed upon the ATD signal trigger. The output signal of this flip-flop is output from the ring oscillator activation circuit 10 as the one-shot signal LTO. The DST generation circuit 12 is made up as a counter from a ring oscillator and a frequency division circuit (a frequency divider), and it starts its count upon triggering by the one-shot signal LTO which is the output signal of the ring oscillator activation circuit 10, and generates the signal DST for initializing the ring oscillator activation circuit 10 based upon this count value.

Figure 2:
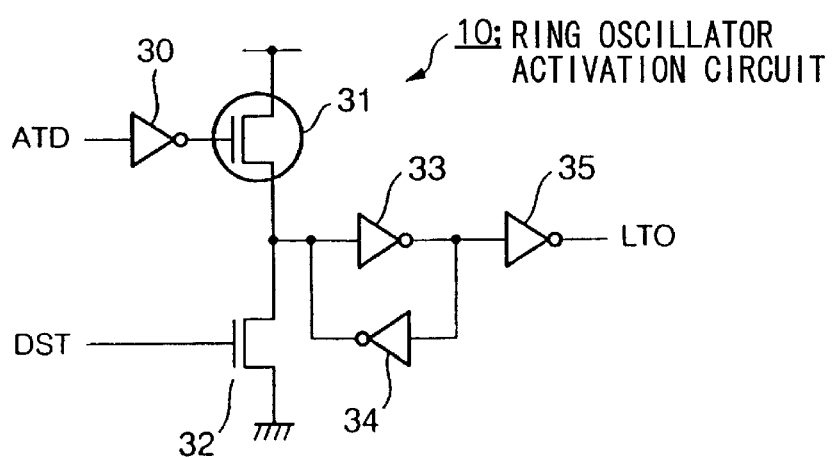
FIG. 2 is a circuit diagram of a ring oscillator activation circuit according to the first embodiment of the present invention.

FIG. 2 shows an example of a structure for the ring oscillator activation circuit 10.

This ring oscillator activation circuit 10 basically functions as a so called RS type flip-flop, and mainly consists of a flip-flop which is made up from inverters 33 and 34 which are cross coupled. Among one pair of coupled nodes of this flip-flop, one of the nodes is connected to the power supply via a p-type field effect transistor 31, and moreover is connected to earth via an n-type field effect transistor. Among these transistors, the ATD signal which is output from the address transition detection circuit 3 is inverted by the inverter 30 and is supplied to the gate of the p-type field effect transistor 31, and the signal DST from the DST generation circuit 12 is supplied to the gate of the n-type field effect transistor 32. Furthermore, the input section of an inverter 35 which functions as a driver is connected to the other one of the nodes of the flip-flop which is made up from the inverters 33 and 34, and the inverter 35 supplies the signal which appears at this node as the one-shot signal LTO.

Figure 3:
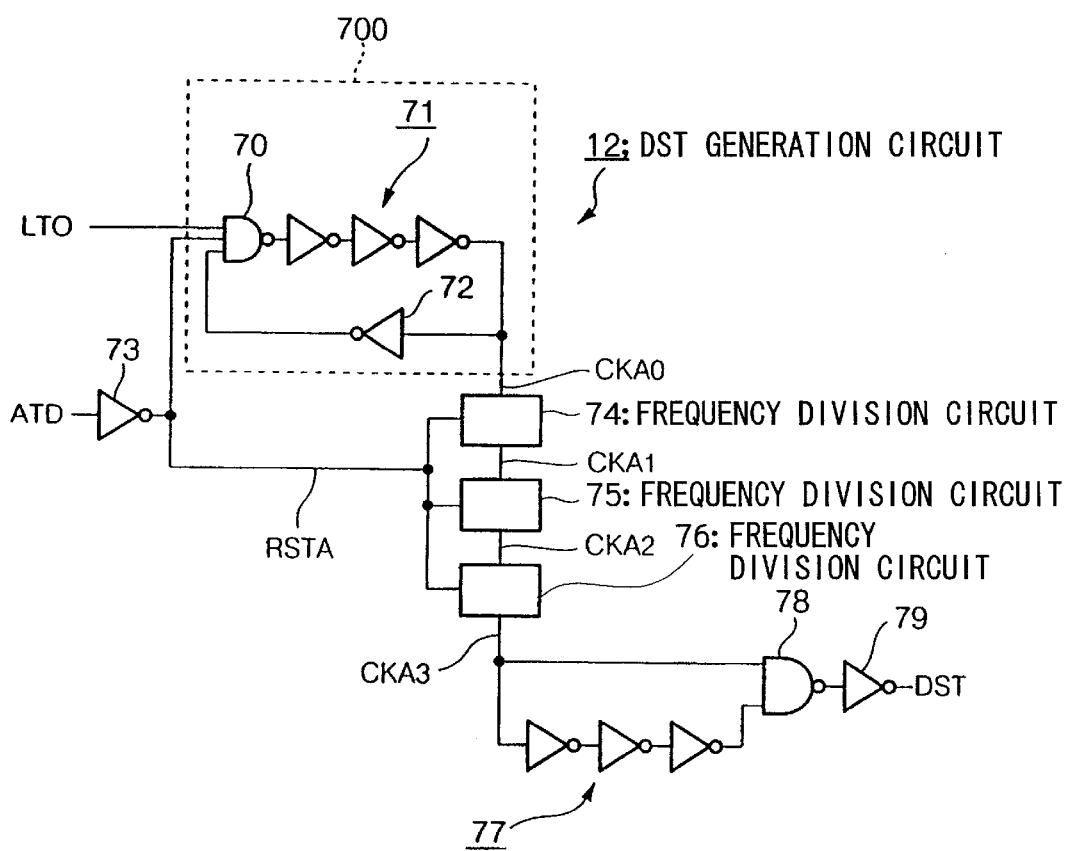
FIG. 3 is a circuit diagram of a DST generation circuit which controls the end timing of a one-shot signal LC according to the first embodiment of the present invention.

FIG. 3 shows the structure of the DST generation circuit 12.

In this figure, the reference symbol 700 denotes a ring oscillator. This ring oscillator 700 is made up by connecting a NAND gate 70, an inverter chain 71, and an inverter 72 in a ring configuration. A signal (the output signal of the inverter 72) which circulates around this ring oscillator is applied to the NAND gate 70, and a reset signal RSTA which is the inverted signal of the ATD signal and the one-shot signal LTO are also input thereto, and the activation state of this ring oscillator is controlled. A clock signal CKA0 which appears at the output section of the inverter chain 71 constitutes the oscillation output of this ring oscillator 700.

The reference symbols 74, 75, and 76 denote frequency division circuits which are connected in cascade. These frequency division circuits are for frequency dividing the clock signal CKA0 which is the oscillation output of the ring oscillator 700, and are reset by the reset signal RSTA. In this example, since the three stages of frequency division circuit 74, 75, and 76 are connected in cascade, the clock signal CKA3 which appears at the output of the frequency division circuit 76 has a period of eight times (two to the third power) that of the clock signal CKA0 which is the oscillation output of the ring oscillator 700. This ring oscillator 700 and frequency division circuits 74, 75, and 76 constitute a counter.

The reference symbol 73 denotes an inverter which inverts the ATD signal and outputs the reset signal RSTA, the reference symbol 77 denotes an inverter chain which functions as a delay circuit, the reference symbol 78 denotes a negative logical product (NAND) gate, and the reference symbol 79 denotes an inverter which serves as a driver. The inverter chain 77 and the NAND gate 78 and the inverter 79 constitute a pulse generation circuit which detects the rising edge of the clock signal CKA3 which is output from the frequency division circuit 76, and generates the signal DST which has the predetermined pulse width.

Figure 4:
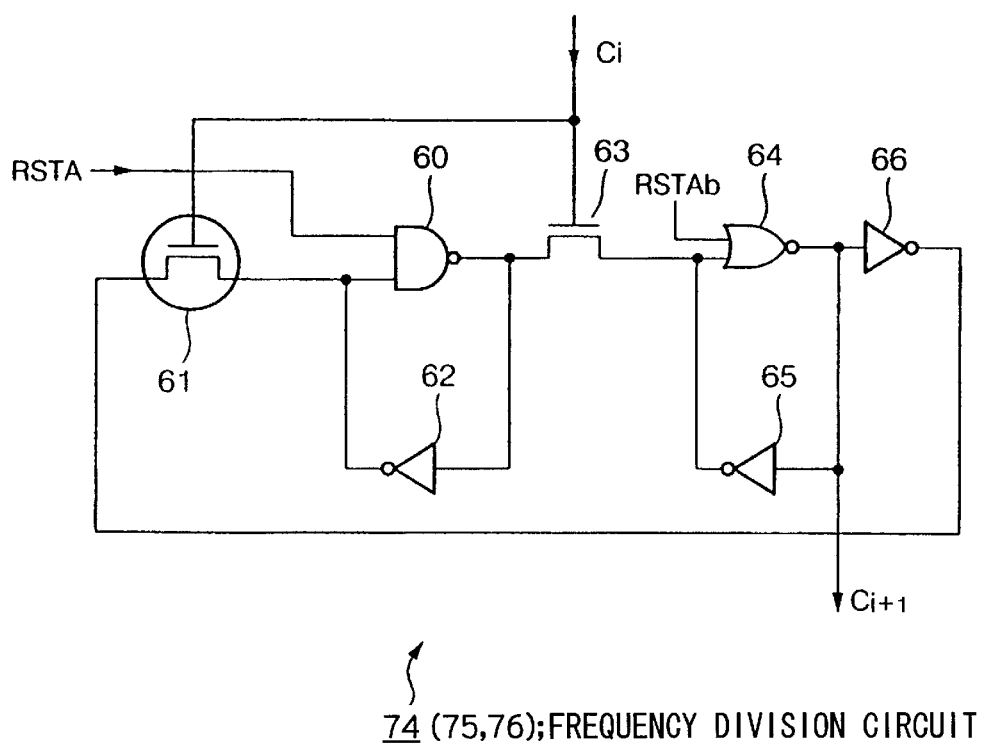
FIG. 4 is a circuit diagram showing an example of a structure of a frequency division circuit according to the first embodiment of the present invention.

FIG. 4 shows the structure of the frequency division circuit 74. The other frequency division circuits 75 and 76 are structured identically to the frequency division circuit 74. The frequency division circuit 74 is structured in closed loop form by two flip-flops, a master side and a slave side, and generates an output signal Ci+1 which has a period twice that of the input signal Ci by circulating a data signal latched by the flip-flops based upon the input signal Ci.

This will now be explained in more detail. In this figure, the reference symbol 60 denotes a NAND gate, the reference symbol 61 denotes a p-type field effect transistor, the reference symbols 62, 65, and 66 denote inverters, the reference symbol 63 denotes an n-type field effect transistor, and the reference symbol 64 denotes a negative logical sum (NOR) gate. Here, the NAND gate 60 and the inverter 62 constitute the master side flip-flop, and this flip-flop is reset by the reset signal RSTA.

Furthermore, the NOR gate 64 and the inverter 64 constitute the slave side flip-flop, and this flip-flop is reset by the inverted signal RSTAb of the reset signal RSTA. The output section of the master side flip-flop and the input section of the slave side flip-flop are connected together via an n-type field effect transistor 63, and the output section of the slave side flip-flop and the input section of the master side flip-flop are connected together via a p-type field effect transistor 61.

According to this structure for the frequency division circuit, the p-type field effect transistor 63 and the n-type field effect transistor 61 conduct complementarily based upon the input signal Ci, and these flip-flops transmit the data signal. Since at this time the data signal which is transmitted by the flip-flops is one or the other of low level and high level over one period in which the input signal Ci goes to low level and to high level, as a result, the output signal Ci+1 comes to have a period twice that of the input signal Ci.

In the following, the operation of this one-shot signal generation circuit according to the first embodiment shown in FIG. 1 will be explained with reference to the timing chart shown in FIG. 5.

In the initial state, the circuit state is initialized in advance so that the one-shot signal LTO and the signal DST are at low level. In concrete terms, the p-type field effect transistor 31 and the n-type field effect transistor 32 shown in FIG. 2 are in the OFF state, while the flip-flop which is made up from the inverters 33 and 34 is initialized so that the one-shot signal LTO is at low level. Furthermore, the ring oscillator 700 shown in FIG. 3 and the frequency division circuits 74, 75, and 76 are initialized so that the clock signals CKA0, CKA1, and CKA2 are at low level. In other words, the count value of the counter which is made up from this ring oscillator 700 and these frequency division circuits 74, 75, and 76 is reset.

It should be understood that, according to the structure of the frequency division circuit shown in FIG. 4, when the flip-flops on the master side and the slave side are respectively initialized by the reset signals RSTA and RSTAb, the outputs signal Ci+1 of the NOR gate 64 is set to low level, and the output signal of the NAND gate 60 is set to high level. Due to this, the inverter 66 supplies the high level which is the inverted signal of the output signal Ci+1 to the NAND gate 60 via the p-type field effect transistor 61 which is in the ON state. At this time, the inverter 62 outputs low level in response to the high level of the output from the NAND gate 60. As a result, the low level which is output by the inverter 62 and the high level which is output by the inverter 66 compete at the same node, and a DC current is generated between the power supply and the earth. However, this problem is solved in practice by setting the current capacities of the inverters 62 and 66 and the p-type field effect transistor 61 to be small, If the logical value of an address signal IA0–IAX changes from the initial state, and its signal level undergoes transition over the period ① shown in FIG. 5, the address transition detection circuit 3 detects this signal transition, and outputs high level as an ATD signal. When the ring oscillator activation circuit 10 receives an ATD signal at high level from the address transition detection circuit 3, the p-type field effect transistor 31 shown in FIG. 2 turns on, and the stable state of the flip-flop which is made up of the inverters 33 and 34 is inverted. As a result, the inverter 35 outputs high level as the signal level of the one-shot signal LTO. When the one-shot signal LTO goes to high level, the ring oscillator 700 within the DST generation circuit which receives this one-shot signal LTO is activated. At this time the ring oscillator does not commence oscillatory operation even if the one-shot signal LTO becomes high level, since the reset signal RSTA which is the inverted signal of the ATD signal goes temporarily to low level.

Next, when the ATD signal returns to low level and the reset signal RSTA reverts to high level, the ring oscillator 700 starts oscillatory operation, and the clock signal CKA0 is output. The frequency division circuit 74 receives the clock signal CKA0 and outputs the clock signal CKA1 which has twice the period thereof. At this time, the frequency division circuit 75 changes to high level at the starting edge of the second pulse of the clock signal CKA0, in other words at the second period starting edge. In summary, the clock signal CKA1 goes to high level with a delay with respect to the clock signal CKA0 of just one period of this clock signal CKA0.

Figure 5:
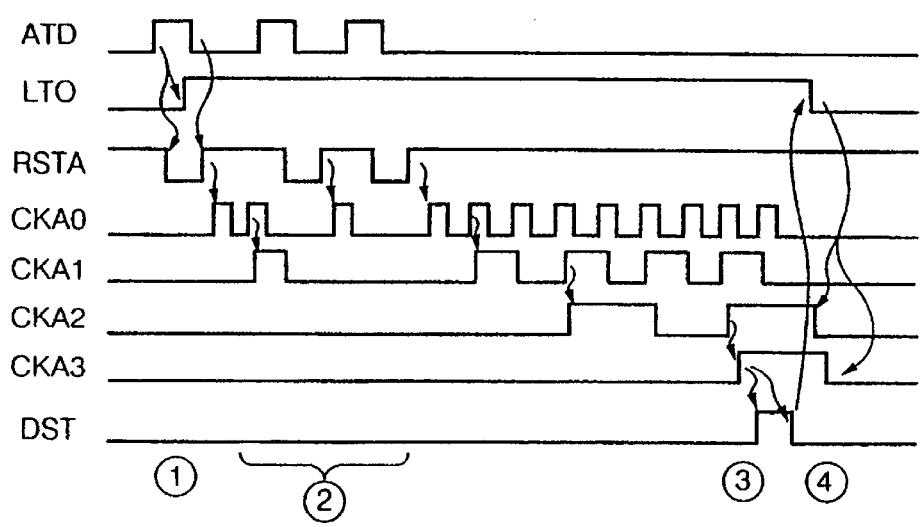
FIG. 5 is a timing chart for explanation of the operation of the first embodiment of the present invention.

Next, if at any time an ATD signal is generated due to skew of the address signal or the like over the period ② shown in FIG. 5, the ring oscillator 700 is activated in response to this ATD signal, and the clock signal CKA0 is generated. At this time, the count value of the counter which is made up from the ring oscillator 700 and the frequency division circuits 74, 75, and 76 is reset as required. After this, when the skew period of the address signal has passed and the final ATD signal has been generated, the clock signals CKA0, CKA1, and CKA2 are successively generated in response to this ATD signal.

At this time, as described above, the clock signal CKA1 goes to high level with a delay of just one period of the clock signal CKA0. In the same manner, the clock signal CKA2 goes to high level with a delay with respect to the clock signal CKA1 of just one period of this clock signal CKA1, and the clock signal CKA3 goes to high level with a delay with respect to the clock signal CKA2 of just one period of this clock signal CKA2.

In summary, with this example, by frequency dividing the clock signal CKA0 by eight, the clock signal CKA3 is obtained which goes to high level with a delay with respect to the clock signal CKA0 of just seven periods of this clock signal CKA0.

Next, the pulse generation circuit which is made up from the inverter chain 77, the NAND gate 78, and the inverter 79 detects the rising edge of the clock signal CKA3, and generates the signal DST which has a pulse width which corresponds to the delay time of the inverter chain 77. When this signal DST goes to high level in the period ③ shown in FIG. 5, the n-type field effect transistor 32 within the ring oscillator activation circuit 10 shown in FIG. 2 turns on, and the stable state of the flip-flop which is made up from the inverters 33 and 34 returns to its initial state. Due to this, the one-shot signal LTO which is output by this ring oscillator activation circuit 10 goes to low level.

By the above, the one-shot signal LTO is generated in response to changes in the address signal IA0–IAX.

According to this first embodiment, the start edge of the one-shot signal LTO is determined by the start edge of the ATD signal which is generated in response to change of the initial address signal in the skew period of the address signal; and, furthermore, the end edge of this one-shot signal LTO is determined by the ATD signal which is generated in response to change of the final address signal in the same skew period. Because of this, even if due to skew of the address signal the pulse width of the ATD signal which is output from the address transition detection circuit 3 varies or it is divided into a plurality of pulses, the timing of the start edge and the end edge of the one-shot signal LTO is determined unambiguously, and this one-shot signal is generated as a single pulse signal. Accordingly, it becomes possible to generate the one-shot signal stably and with high accuracy.

<Embodiment 2>

In the following, a second embodiment of the present invention will be explained.

Figure 6:
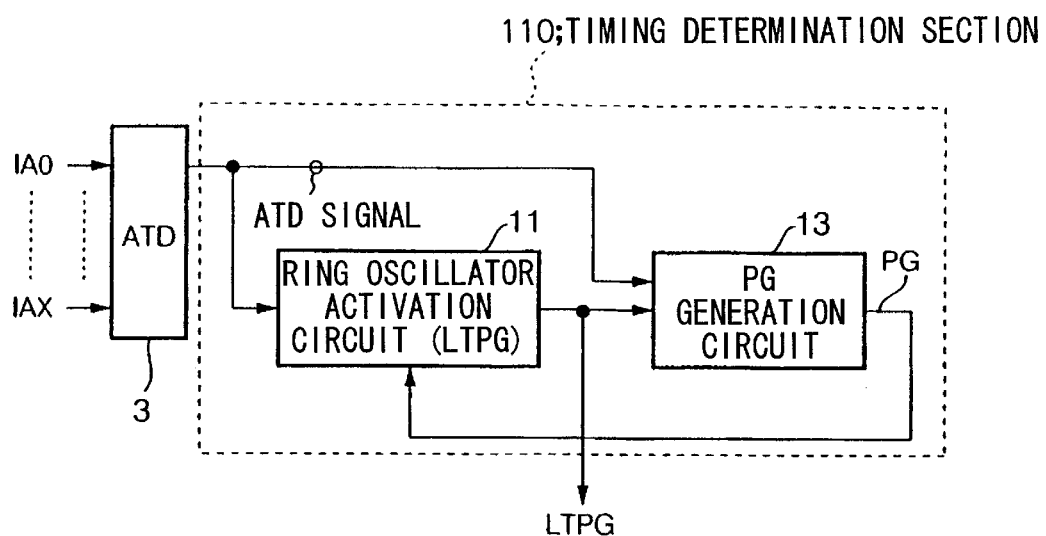
FIG. 6 is a block diagram showing the structure of a timing determination section according to the second embodiment of the present invention.

The structure of the one-shot signal generation circuit according to this second embodiment of the present invention is shown in FIG. 6. With the first embodiment, it was arranged that the timing of the end edge of the one-shot signal was determined according to the final ATD signal in the skew period of the address signal; but, in this second embodiment, the timing of both the start edge and the end edge of the one-shot signal are determined by the single initial ATD signal in the same skew period.

In FIG. 6, the reference symbol 3 denotes an address transition detection circuit (ATD), and it is the same as the one according to the first embodiment. The reference symbol 110 denotes a timing determination section, and this, along with functioning as a circuit section for generating a one-shot signal LTPG, also is a timing determination section which determines the timing of the edge of this one-shot signal LTPG. This timing determination section 110 is made up from a ring oscillator activation circuit 11 and a PG generation circuit 13, and it starts its count upon triggering by the edge of the ATD signal which is initially output from the address transition detection circuit 3 in the skew period of the address signal, and determines the timing of both the start edge and the end edge of the one-shot signal LTO based upon its count value.

Here, the ring oscillator activation circuit 11 has the same structure as the ring oscillator activation circuit 10 according to the first embodiment, and it controls the activation state of the ring oscillator which constitutes the PG generation circuit 13. The output signal of the ring oscillator activation circuit 11 is the one-shot signal LTPG. The PG generation circuit 13 is structured as a counter which is made up from a ring oscillator and a frequency division circuit, and it starts its count upon triggering by the one-shot signal LTPG which is the output signal of the ring oscillator activation circuit 11, and generates the signal PG for initializing the ring oscillator activation circuit 11 based upon its count value.

Figure 7:
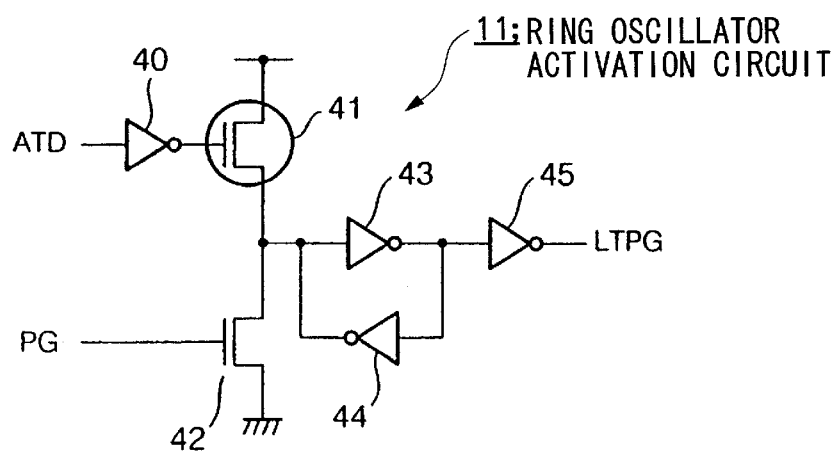
FIG. 7 is a circuit diagram of a ring oscillator activation circuit according to the second embodiment of the present invention.

FIG. 7 shows an example of the structure of the ring oscillator activation circuit 11. This ring oscillator activation circuit 11 is made up from an inverter 40, a p-type field effect transistor 41, an n-type field effect transistor 42, and inverters 43, 44, and 45, and these correspond to the inverter 30, the p-type field effect transistor 31, the n-type field effect transistor 32, and the inverters 33, 34, and 35 of the ring oscillator activation circuit 10. It should be understood that the ATD signal from the address transition detection circuit 3 is inverted by the inverter 40 and is supplied to the gate of the p-type field effect transistor 41, while the signal PG from the PG generation circuit 13 is supplied to the gate of the n-type field effect transistor 42. Furthermore, the output signal of the inverter 45 is the one-shot signal LTPG.

Figure 8:
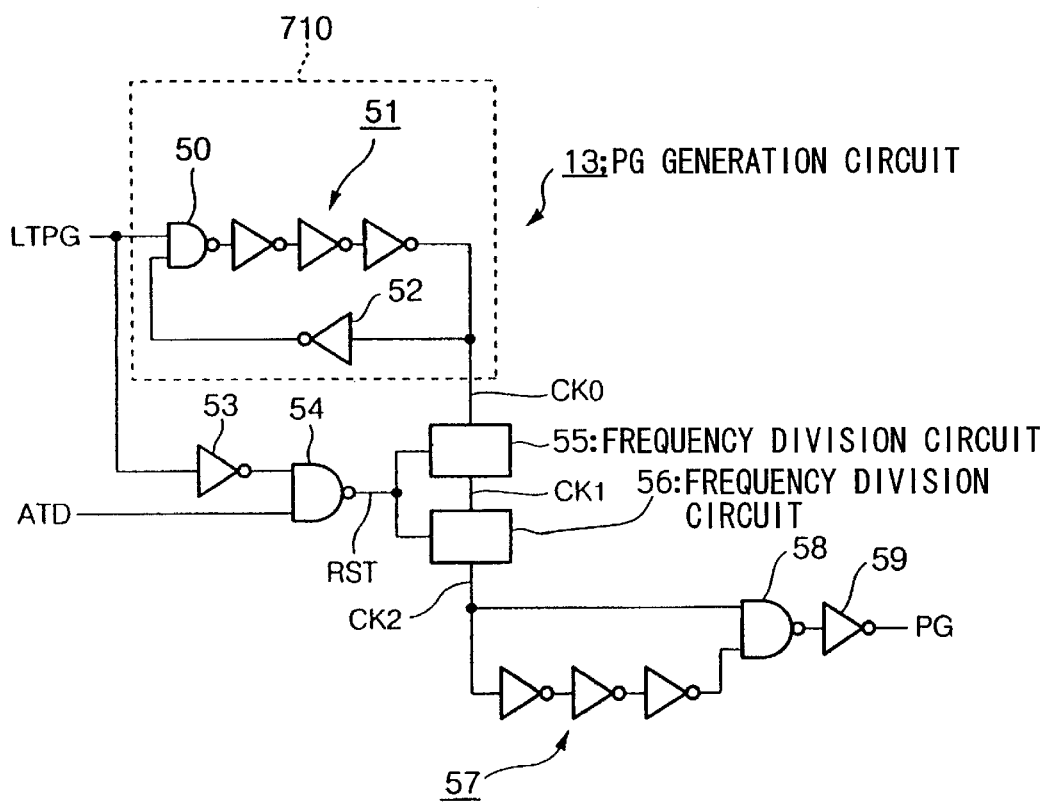
FIG. 8 is a circuit diagram of a PG generation circuit 13 which controls the timing of generation of a one-shot signal LC according to the second embodiment of the present invention.

FIG. 8 shows the structure of the PG generation circuit 13. In this figure, the reference symbol 710 denotes a ring oscillator. For this ring oscillator 710, a two input NAND gate 50 is provided in the ring oscillator 700 shown in FIG. 3 according to the first embodiment, instead of the three input NAND gate 70. The signal which circulates in the ring oscillator 710 and the one-shot signal LTPG which is output from the ring oscillator activation circuit 11 are input to this NAND gate 50, but no signal is input which corresponds to the reset signal RSTA. The inverter chain 51 and the inverter 52 which make up this ring oscillator 710 correspond respectively to the inverter chain 71 and the inverter 72 shown in FIG. 3.

The reference symbols 55 and 56 denote frequency division circuits, and correspond to the frequency division circuits 74, 75, and 76 shown in FIG. 3. However, by contrast to the use of three stages of frequency division circuit connected in cascade as in the example shown in FIG. 3, the second embodiment employs two stages of frequency division circuit. The number of stages of these frequency division circuits which are connected is suitably set according to the timing of the edge of the one-shot signal LTPG which is required. The structure of each of the frequency division circuits 55 and 56 is the same as that shown in FIG. 4. The reference symbols 57, 58, and 59 respectively correspond to the inverter chain 77, the NAND gate 78, and the inverter 79 shown in FIG. 3, and they make up a pulse generation circuit which detects the rising edge of the clock signal CK2 which is output from the frequency division circuit 56 and generates a signal PG having the predetermined pulse width.

In the following, the operation of the one-shot signal generation circuit shown in FIG. 6 according to this second embodiment will be explained with reference to the timing chart shown in FIG. 9.

It will be supposed that, in the initial state, the states of the circuits are initialized in advance so that the one-shot signal LTPG and the signal PG are at low level. From this initial state, when an address signal IA0–IAX changes in the period ① shown in FIG. 9, the address transition detection circuit 3 outputs high level as the ATD signal.

In response to an ATD signal at high level from the address transition detection circuit 3, the ring oscillator activation circuit 11 outputs high level as the signal level of the one-shot signal LTPG. When the one-shot signal LTPG becomes high level, the ring oscillator 710 within the PG generation circuit 13 which receives the one-shot signal LTPG is activated and starts its oscillatory operation, and outputs the clock signal CK0.

Here, since the one-shot signal LTPG is generated as a trigger for the ATD signal, during the process in which the one-shot signal LTPG goes to high level with a delay with respect to the ATD signal, the state occurs in which the ATD signal is high level and the one-shot signal LTPG is low level. In this state, the NAND gate 54 outputs low level as the reset signal RST, and due to this the clock signals CK1 and CK2 which are output from the frequency division circuits 55 and 56 are both reset to low level. In other words, the count value of the counter which is made up from the ring oscillator 710 and the frequency division circuits 55 and 56 is reset.

Next, the frequency division circuit 55 receives and frequency divides the clock signal CK0 which is output from the ring oscillator 710, and the clock signal CK1 goes high level with a delay of just one period of this clock signal CK0. In the same manner, the frequency division circuit 56 receives and frequency divides the clock signal CK1, and the clock signal CK2 goes high level with a delay of just one period of this clock signal CK1. In this example, by frequency dividing the clock signal CK0 by four, a clock signal CK2 is obtained which goes high level with a delay of just three periods of the clock signal CK0.

Next, the pulse signal generation circuit which is made up from the inverter chain 57, the NAND gate 58, and the inverter 59 detects the rising edge of the clock signal CK2, and outputs the signal PG which has a pulse width which corresponds to the amount of delay by the inverter chain 57. When this signal PG goes to high level, the n-type field effect transistor 42 within the ring oscillator activation circuit 11 shown in FIG. 7 turns on, and the one-shot signal LTPG goes to low level.

According to the above, the one-shot signal LTPG is generated in response to the change of the address signals IA0–IAX.

According to this second embodiment, the start edge and the end edge of the one-shot signal LTPG are determined by the start edge of the ATD signal which is generated in response to change of the initial address signal in the skew period of the address signal. Due to this, even if due to skew of the address signal the pulse width of the ATD signal which is output from the address detection circuit 3 changes or it is separated into a plurality of pulses, the timing of the start edge and the end edge of the one-shot signal LTO is determined unambiguously, and it is possible to generate a one-shot signal having a constant pulse width stably and with high accuracy.

<Embodiment 3>

In the following, a third embodiment of the present invention will be explained.

In this third embodiment, a one-shot signal generation circuit will be explained which generates a one-shot signal as a latch signal which is used for latching an external address, by the timing determination section 100 according to the first embodiment and the timing determination section 110 according to the second embodiment being employed together.

FIG. 10 is a block diagram showing the structure of the one-shot signal generation circuit according to this third embodiment. Moreover, a circuit diagram of an LC generation circuit 14 and an example of its operational waveform are respectively shown in FIGS. 11A and 11B. In FIG. 10, the same reference symbols are assigned to structural elements which are common to the first and second embodiments.

The ring oscillator activation circuit (LT0) 10, the ring oscillator activation circuit (LTPG) 11, the DST generation circuit 12, and the PG generation circuit 13 are connected as shown in FIG. 10, and the ATD signal from the address transition detection circuit 3 shown in FIG. 1 is supplied to each of these circuits.

In other words, this one-shot signal generation circuit according to the third embodiment is structured to comprise the timing determination section 100 according to the first embodiment, the timing determination section 110 according to the second embodiment, and an LC generation circuit which receives the signals DST and PG which are output from these timing determination sections 100 and 110, and which generates a signal LC.

Each of these circuits will be explained below in order. In addition to the ATD signal, the signal DST which is the output signal from the DST generation circuit 12 which will be explained hereinafter is supplied to the ring oscillator activation circuit (LT0) 10 as a reset signal, and, during the period from input of a pulse of the ATD signal until the address latch is released, it generates the signal LT0 and puts the frequency division circuit of the DST generation circuit 12 into the operational state. It should be understood that, although in the first embodiment the signal LT0 was output as the one-shot signal, in this third embodiment, the signal LT0 serves as a single intermediate signal for generating a latch signal LC as the one-shot signal.

The structure and the operation of the ring oscillator activation circuit 10 will be explained anew using the previously described FIG. 2 and FIG. 5. FIG. 2 shows a circuit diagram of the ring oscillator activation circuit (LT0) 10, while FIG. 5 shows an example of the operational waveforms of various sections of this ring oscillator activation circuit (LT0) 10. In FIG. 5, the ATD signal is input from the address transition detection circuit 3 at the time ①, the signal LTO rises with a certain operational delay, and goes to high level. The high level of the signal LTO is maintained as it is and does not change, even if the ATD signal is input again during the period ②. The signal DST is input to the ring oscillator activation circuit 10 from the DST generation circuit 12 at the time ③, the signal LTO is reset with a certain operational delay, and goes to low level. By the signal LTO being generated at high level during the period from the input of the pulse of the ATD signal until the release of the address latch, the frequency division circuit which includes the counter within the DST generation circuit 12 at the later stage goes into the operational state.

In addition to the ATD signal, the signal PG which is the output signal of a PG generation circuit 13 which will be described hereinafter is also input to the ring oscillator activation circuit (LTPG) 11 as a reset signal.

The structure and operation of the ring oscillator activation circuit 11 will be explained afresh using the previously described FIG. 7 and FIG. 9. FIG. 7 shows a circuit diagram of the ring oscillator activation circuit (LTPG) 11, and FIG. 9 shows an example of operational waveforms of various sections of the ring oscillator activation circuit (LTPG) 11.

Figure 9:
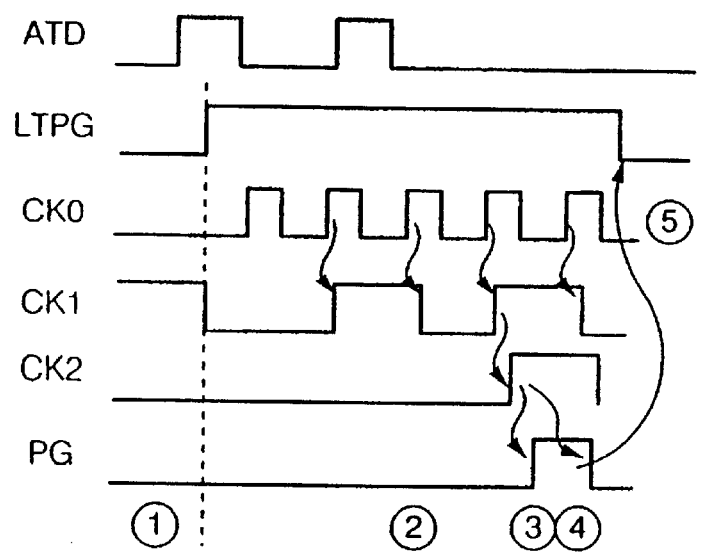
FIG. 9 is a timing chart for explanation of the operation of the second embodiment of the present invention.

In FIG. 9, when the ATD signal is input to the inverter 40 which is included in the ring oscillator activation circuit 11 at the time ①, the signal LTPG rises up to high level with a certain operational delay. After this, even if the ATD signal is further input in the period ②, the high level of the signal LTPG is maintained just as it is and does not change. When the signal PG is input to the ring oscillator activation circuit 11 from the PG generation circuit 13 at the time ③, the signal LTPG is reset with a certain operational delay, and returns to low level. While the signal LTPG is at high level, the frequency division circuit which constitutes the counter within the PG generation circuit 13 at the later stage goes into the operational state.

Next, the structure and operation of the PG generation circuit 13 will be explained afresh using the previously described FIG. 8 and FIG. 9. FIG. 8 shows a circuit diagram of the PG generation circuit 13, and FIG. 9 shows an example of operational waveforms of various sections of the PG generation circuit 13. Furthermore, the reference symbols 55 and 56 shown in FIG. 8 denote frequency division circuits, and a circuit example of these frequency division circuits is shown in FIG. 4.

In these figures, if the ATD signal is input to the PG generation circuit 13 from the address transition detection circuit 3 at the time ③ when the signal LTPG which is the output signal of the ring oscillator activation circuit (LTPG) is low level, a clock signal CK1 which is the output signal of the frequency division circuit 55 and a clock signal CK2 which is the output signal of the frequency division circuit 56 within this PG generation circuit 13 are reset.

When the signal LTPG goes to high level and is input to the NAND gate 50, the ring oscillator 710 which is constituted by the plurality of inverter gates which are connected in cascade (the inverter chain) 51 and the inverter gate 52 starts its operation and outputs the clock signal CK0. This clock signal CK0 is a clock signal for measuring a predetermined period (normally, the skew period of the address signal) from the pulse of the ATD signal which has arrived initially. In other words, this clock signal CK0 is generated as a trigger for the initial ATD signal in the skew period of the address signal, and it is a basic clock signal for determining the timing of the edge of the one-shot signal. In this example, the clock signal CK0 is used as a basic clock signal for obtaining the timing of the end edge of a latch signal LC which is the one-shot signal.

The clock signal CK0 is generated independently of the pulse of the ATD signal which will arrive during the period ②, the frequency division circuits 55 and 56 continue their operation, and the clock signal CK1 is generated by frequency dividing the clock signal CK0; and, when the period of the ring oscillator, in other words a time four times the period of the clock signal CK0, has elapsed at the time ③, the clock signal CK2 which is the output signal of the frequency division circuit 56 goes to high level, and the signal PG which is the output signal of the PG generation circuit 13 is generated. This signal PG indicates the fact that a predetermined time (normally, a time greater than the width of the address skew) has elapsed from the pulse of the ATD signal which has arrived initially in the skew period of the address signal, and it determines the timing of the start edge of the latch signal LC. When this signal PG goes to high level, the signal LTPG which is the output signal of the ring oscillator activation circuit (LTPG) 11 of FIG. 7 goes to low level, and the ring oscillator in the PG generation circuit 13 stops its operation at the time ⑤.

Next, the structure and the operation of the DST generation circuit 12 will be explained anew using the FIG. 3 and FIG. 5. FIG. 3 shows a circuit diagram of the DST generation circuit 12 which controls the end timing of the one-shot signal LC, and FIG. 5 shows the operational waveforms of various sections of the DST generation circuit 12. Referring to these figures, when the signal LTO which is output from the ring oscillator activation circuit (LT0) 10 is input to the NAND gate 70, by the pulse of the first ATD signal which arrives in the period ①, the ring oscillator 700 which is constituted by the plurality of inverter gates 71 connected in a cascade (the inverter chain) and the inverter gate 72 operates and the clock signal CKA0 is generated.

This clock signal CKA0 is a clock signal for measuring a predetermined time (normally, a time equal to or less than the smallest cycle of address change) from the pulse of the ATD signal which has arrived latest in the skew period of the address signal. In this example, the clock signal CKA0 is used as a basic clock signal for obtaining the timing of the start edge of the latch signal LC which is the one-shot signal.

Since the reset signal RSTA becomes low level due to the second and subsequently emitted pulses of the ATD signal during the period ②, the ring oscillator 700 stops its operation each time a pulse of the ATD signal arrives, and each of the frequency division circuits 74, 75, and 76 is reset.

If the period in which no pulse of the ATD signal occurs continues, and a time of eight times the period of the clock signal CKA0 of the ring oscillator 700 from the last pulse of the ATD signal elapses at the time ③, then the clock signal CKA3 which is the output signal of the frequency division circuit 76 goes to high level, and the signal DST is generated and triggers the LC generation circuit 14 at the timing when the predetermined time from the last ATD signal has elapsed.

This signal DST indicates that the predetermined time (normally, a time less than the shortest cycle of address change) has elapsed from the pulse of the ATD signal which has arrived latest, and it determines the timing of the end edge of the latch signal LC. Furthermore, the signal LTO which is the output signal of the ring oscillator activation circuit (LT0), goes to low level due to the falling edge of this signal DST, and the operation of the circuit stops.

Next, the operation of the LC generation circuit 14 of FIG. 10 will be explained. This LC generation circuit 14 inverts the flip-flop to generate the latch signal LC according to input of the signal PG and the signal DST.

Figure 11A:
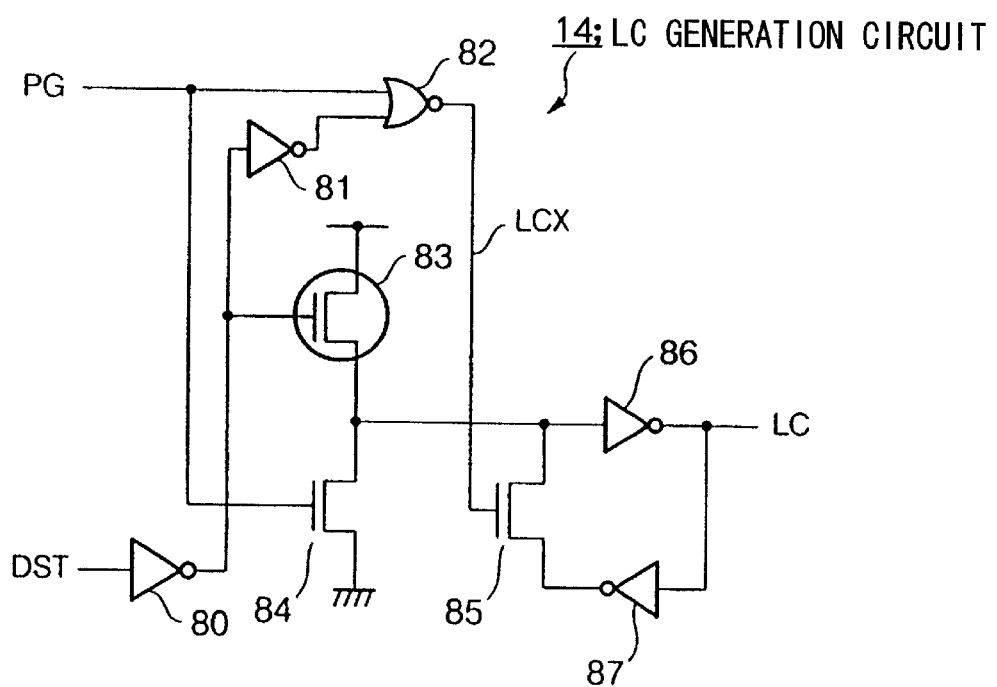
FIG. 11A is a figure showing the structure of an LC generation circuit according to the third embodiment of the present invention.
Figure 11B:
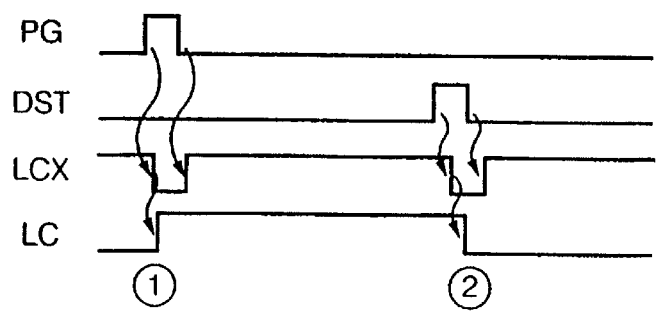
FIG. 11B is a timing chart showing the operational waveforms of various portions of the LC generation circuit according to the third embodiment of the present invention.

FIG. 11A is a circuit diagram of the LC generation circuit 14, and FIG. 11B is an operational waveform diagram of various sections of the LC generation circuit 14.

In FIG. 11A, the reference symbols 80, 81, 86, and 87 denote inverters, the reference symbol 82 denotes a NOR gate, the reference symbol 83 denotes a p-type field effect transistor, and the reference symbols 84 and 85 denote n-type field effect transistors. Here the inverter 86, the inverter 87, and the n-type field effect transistor 85, which form a closed loop, constitute a flip-flop. Along with the input section of the inverter 86 being connected to the power supply via the p-type field effect transistor 83, it is connected to earth via the n-type field effect transistor 84. The signal DST is inverted by the inverter 80 and is supplied to the gate of the p-type field effect transistor 83, and the signal PG is supplied to the gate of the n-type field effect transistor 84. Furthermore, along with the signal PG being supplied to one of the input sections of the NOR gate 82, the signal DST is supplied via the inverters 80 and 81 to its other input section, and the output signal of this NOR gate 82 is supplied to the gate of the n-type field effect transistor 85.

According to this structure of the LC generation circuit 14, the signal LCX goes to low level at the time ① in FIG. 11B, due to the signal PG going to high level. Because of this, the n-type field effect transistor 84 turns on and the n-type field effect transistor 85 turns off, with the result that the flip-flop which consists of the inverters 86 and 87 is inverted, and the latch signal LC goes to high level. Here, the inversion of the flip-flop is quickly performed by the n-type field effect transistor 85 which forms the closed loop of the flip-flop turning off, since the drain of the n-type field effect transistor 84 is electrically isolated from the output section of the inverter 87.

Furthermore, the signal LCX goes to low level due to DST going to high level at the time ②. Because of this, the p-type field effect transistor 83 turns on and the n-type field effect transistor 85 turns off, with the result that the flip-flop which consists of the inverters 86 and 87 is again inverted, and the latch signal LC goes to low level. In this case as well, since the n-type field effect transistor 85 turns off, the drain of the p-type field effect transistor 83 is electrically isolated from the output section of the inverter 87, and inversion of the flip-flop is performed quickly.

Accordingly, the interval of the period ② from the period ① becomes the period over which the latch signal LC is output. This latch signal LC is supplied to the latches 2-0, 2-1 to 2-X shown in FIG. 18 which will be described hereinafter, and the address data is latched with this latch signal LC as a trigger.

By providing this type of circuit structure, it is possible to determine the generation timing (the timing of the start edge) and the end timing (the timing of the end edge) of the one-shot signal by the ring oscillators and the frequency division circuit within the timing determination sections 100 and 110 which are provided in common for all the addresses. As an example, with a memory unit having twenty addresses for a capacity of 16 Mb (1 Mb×16) and whose address skew period is 10 ns, if the address latch signal is released while 30 ns elapses from the last detection of address transition, and the delay time of the inverter of one stage is assumed to be 0.1 ns, then the delay circuit for obtaining the time until the latch is to be released, when estimated with inverter gate conversion, will require about 2200 inverters with the background art. By contrast to this, according to this third embodiment, about 240 inverters will suffice to constitute the ring oscillators within the DST generation circuit 12 and the PG generation circuit 13.

Next, the adjustment of the oscillation periods using the change of the numbers of stages of the inverter gates within the ring oscillators in the PG generation circuit 13 and DST generation circuit 12 will be explained.

Figure 12:
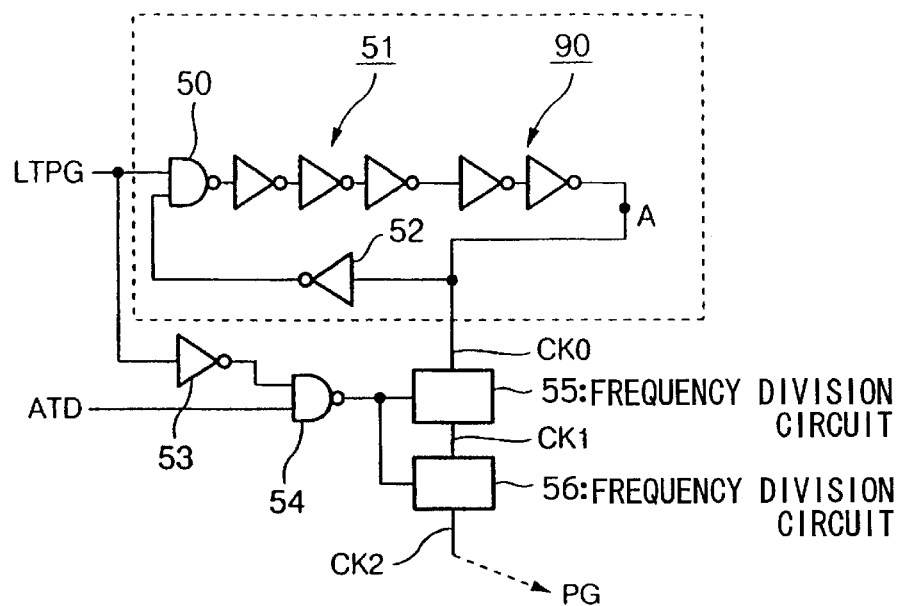
FIG. 12 is a figure explaining adjustment of the period of a PG generation circuit.
Figure 13:
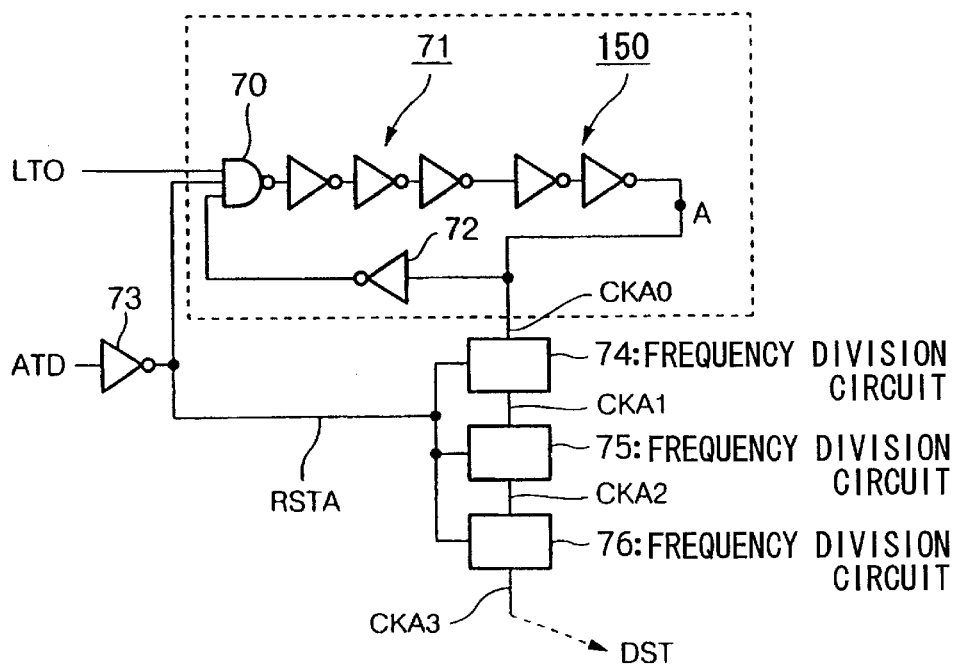
FIG. 13 is a figure explaining adjustment of the period of a DST generation circuit.

FIG. 12 is the PG generation circuit, and FIG. 13 is the DST generation circuit. When two stage inverter chains 90 and 150 are respectively inserted between the points A in these figures and the output sections of the inverter chains 51 and 71, then, by generating a delay of eight inverter stages in the clock signal CK2 of FIG. 12 and a delay of sixteen inverter stages in the clock signal CKA3 of FIG. 13, a contribution is made to reduction of the chip area, since it becomes possible greatly to reduce the number of elements which must be produced.

In this manner, the periods of the clock signals CK0 and CKA0 which are the oscillatory output signals are adjusted by varying the number of stages of inverter chains which constitute the ring oscillators, and accordingly it becomes possible to adjust the timing of the signals PG and DST.

Next, the fine timing adjustment which cannot be coped with only by varying the number of stages of the inverter chains within the ring oscillators will be explained.

Figure 14:
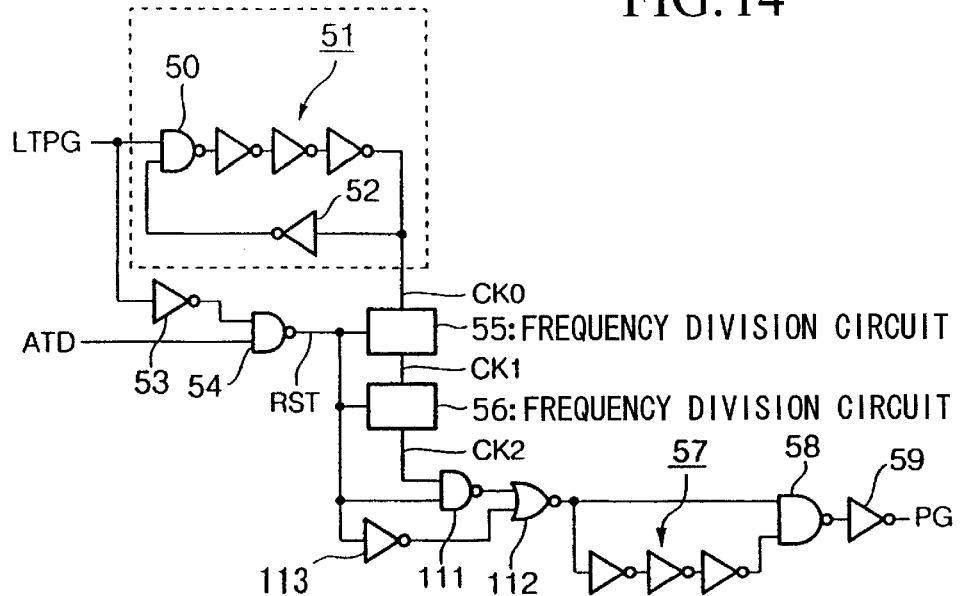
FIG. 14 is a figure explaining adjustment of the period of a PG generation circuit.
Figure 15:
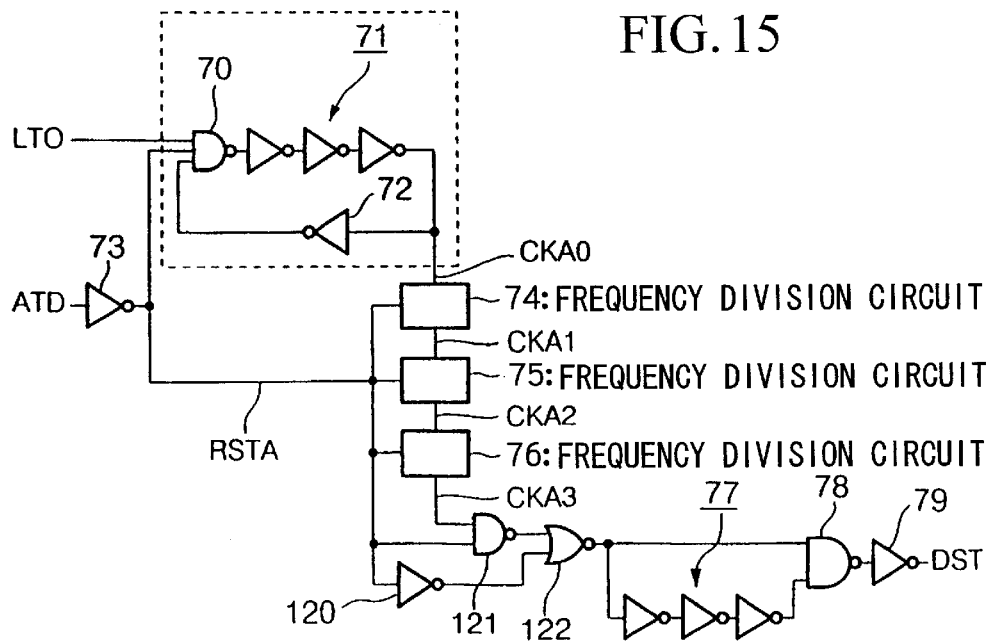
FIG. 15 is a figure explaining adjustment of the period of a DST generation circuit.

FIG. 14 is the PG generation circuit, and FIG. 15 is the DST generation circuit. A NAND gate 111 and a NOR gate 112 are arranged as shown in the figure in the output section of the frequency division circuit 56 of FIG. 14, and a signal passed through the inverter 113 is input to the other input of the NOR gate 112 with the same timing of the reset signal RST. By doing this, it becomes possible to perform fine timing adjustment by delaying the timing of the clock signal CK2 by the amount corresponding to the number of stages of the NAND gate 111 and the NOR gate 112 which have been inserted.

In other words, according to the method of varying the number of stages of the inverter chains within the ring oscillators, even if an attempt is made to adjust the period of the clock signal CK0 finely, the amount of adjustment is amplified due to frequency division in the frequency division circuits. As a result, there is a limit to fine adjustment of the timing of the signals PG and DST. By contrast to this, according to the method shown in FIG. 14, since delay of the clock signal is performed in a stage after the frequency division circuit, this delay amount becomes reflected in the signal PG just as it is, so that it becomes possible to perform fine adjustment of the timing.

In the same way, a NAND gate 121 and a NOR gate 122 are arranged as shown in the figure in the outputs section of the frequency division circuit 76 of FIG. 15, while a signal passed through the inverter 120 is input to the other input of the NOR gate 122 with the same timing of the reset signal RSTA.

By doing this, it becomes possible to perform fine timing adjustment by delaying the timing of the clock signal CKA3 by the amount corresponding to the number of stages of the NAND gate 121 and the NOR gate 122 which have been inserted.

Next, the method of fine timing adjustment for the same PG generation circuit 13 and DST generation circuit 12 will be explained.

Figure 16:
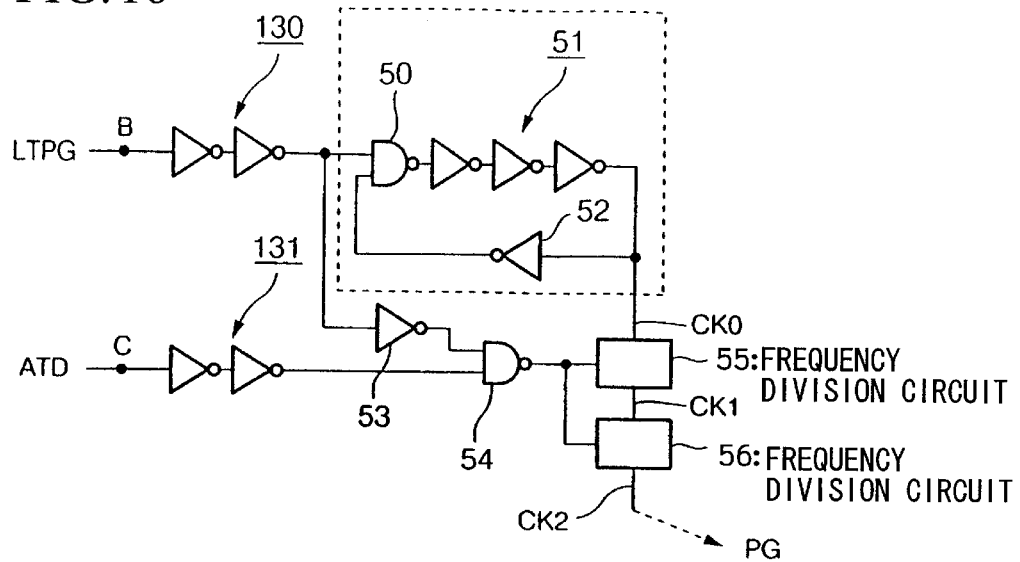
FIG. 16 is a figure explaining adjustment of the period of a PG generation circuit.
Figure 17:
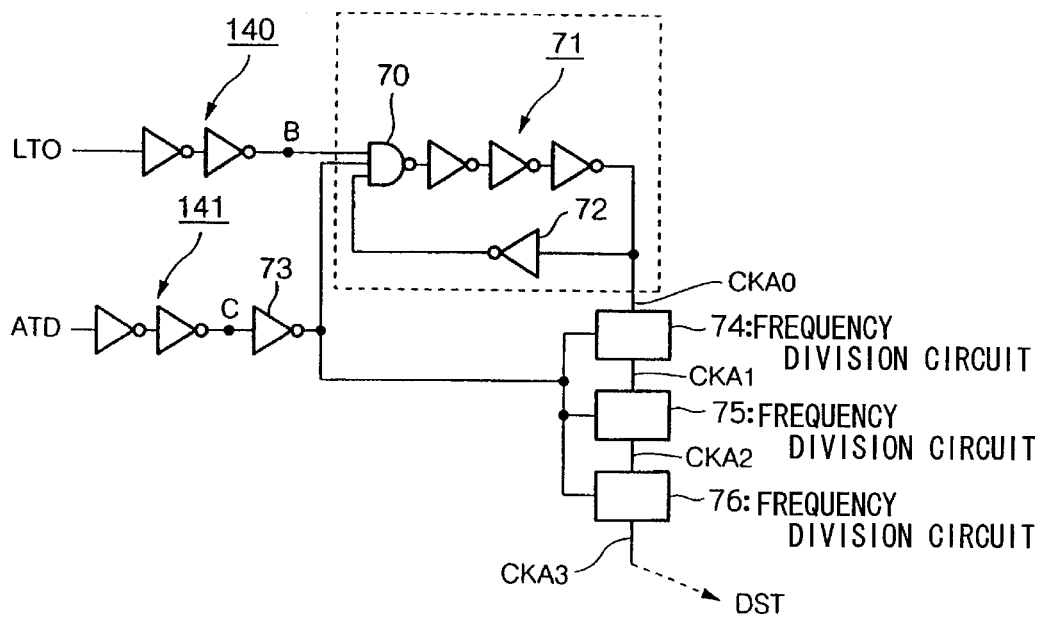
FIG. 17 is a figure explaining adjustment of the period of a DST generation circuit.

FIG. 16 shows the PG generation circuit, and FIG. 17 shows the DST generation circuit.

If two respective stages of inverter gates are inserted in the lines at the points B or C in those figures, the clock signal CK2 or the clock signal CKA3 comes to have the delay amount of these two stages of inverter gate, and it is possible to perform fine timing adjustment.

In this example, the signal LTPG is supplied to the NAND gate 50 via the inverter chain 130, and the ATD signal is supplied to the NAND gate 54 via the inverter chain 131. Furthermore, the signal LT0 is supplied to the NAND gate 70 via the inverter chain 140, and the ATD signal is supplied to the inverter 73 via the inverter chain 141. However, according to requirements, it would be acceptable to increase the number of stages in each of the inverter chains.

In the above, various embodiments of the present invention have been explained.

Next, an example of application of the one-shot signal generation circuit according to the present invention will be explained.

Figure 18:
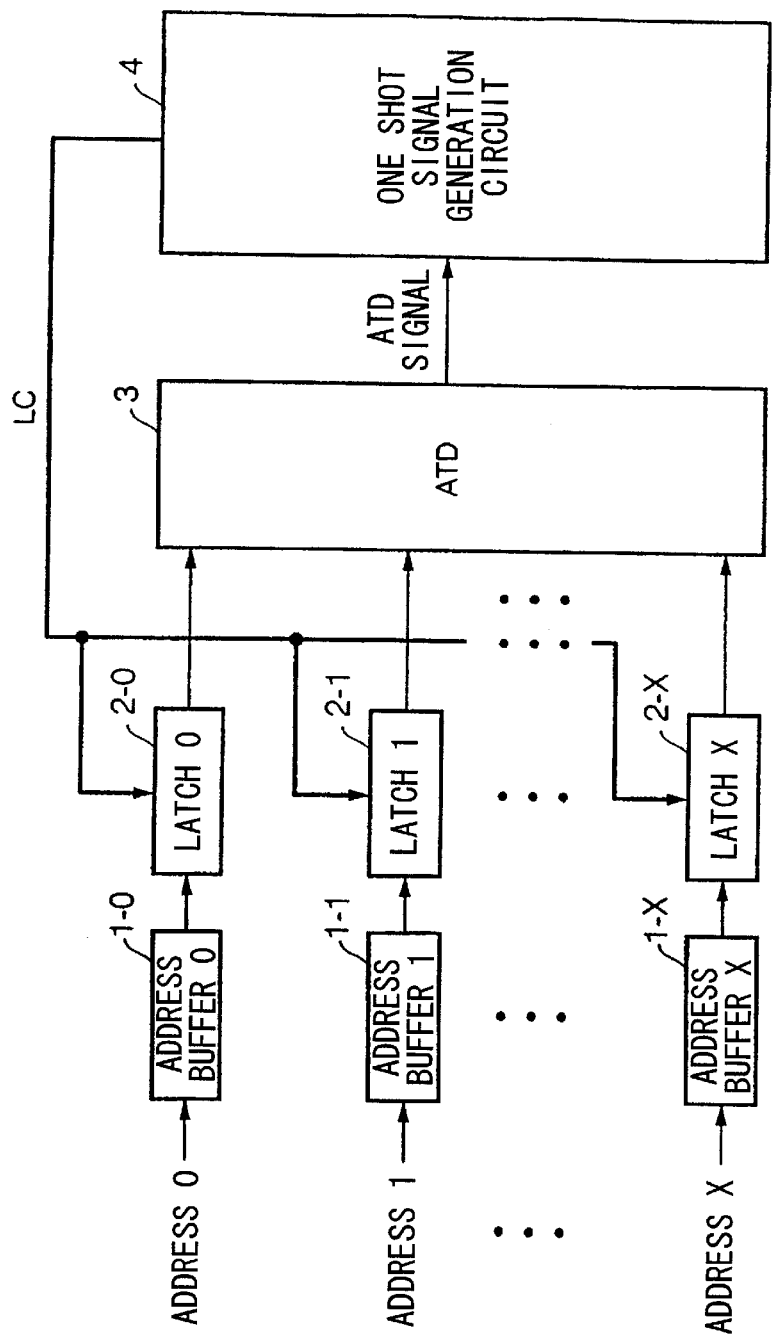
FIG. 18 is a block diagram showing an example of application of the one-shot signal generation circuit according to the present invention.
Figure 19:
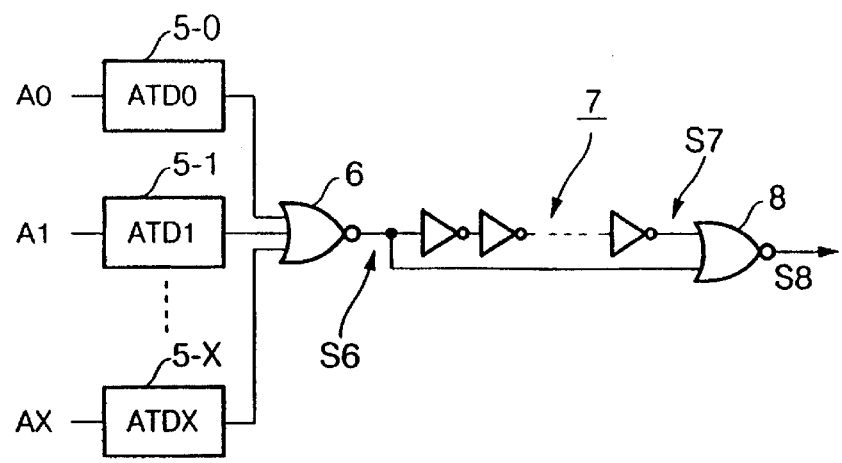
FIG. 19 is a figure showing an example of a structure of a one-shot signal generation circuit according to the background art.
Figure 20:
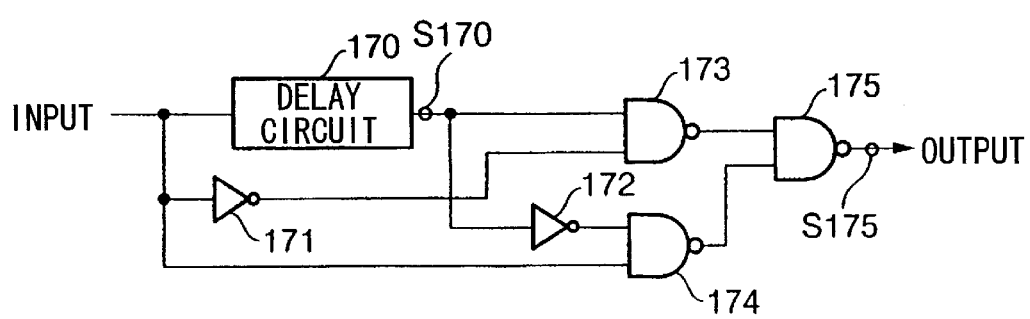
FIG. 20 is a figure showing an example of a structure of an address transition detection circuit (ATD).
Figure 21:
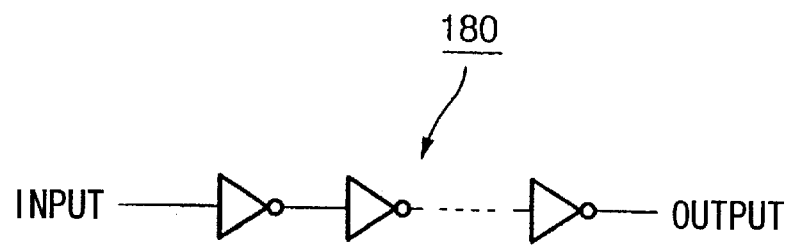
FIG. 21 is a figure showing an example of a structure of a delay circuit according to the background art.
Figure 22:
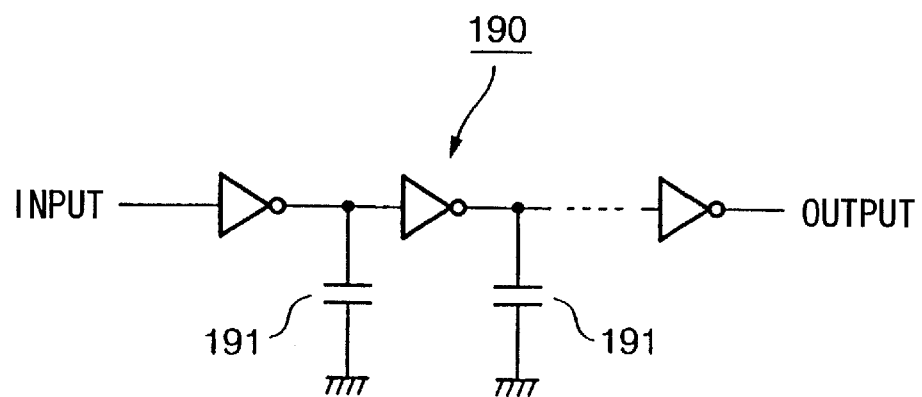
FIG. 22 is a figure showing an example of a structure of a delay circuit according to the background art.
Figure 23:
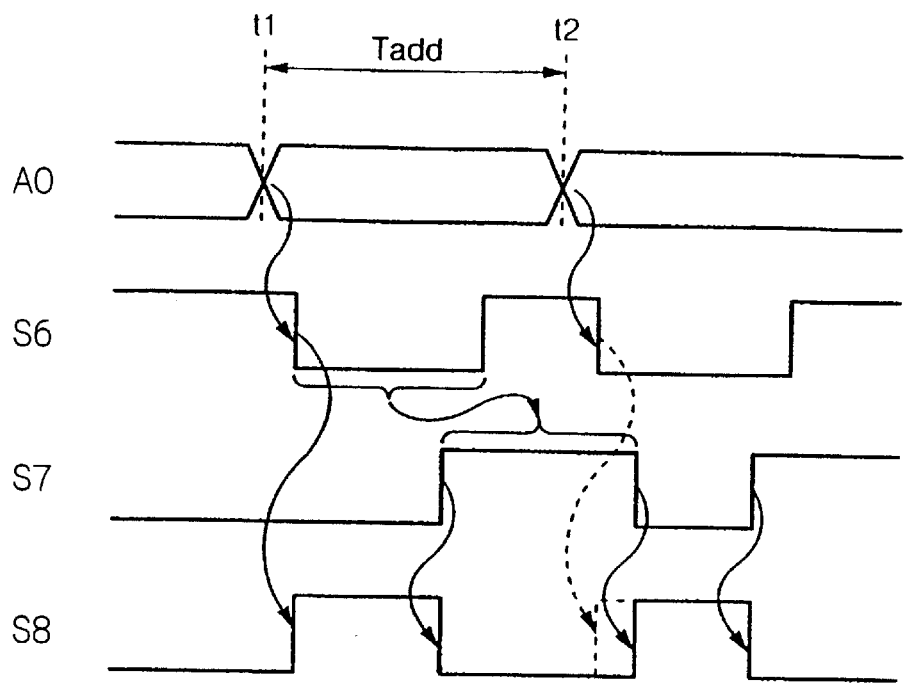
FIG. 23 is a timing chart for explanation of a problem with regard to the background art.
Figure 24:
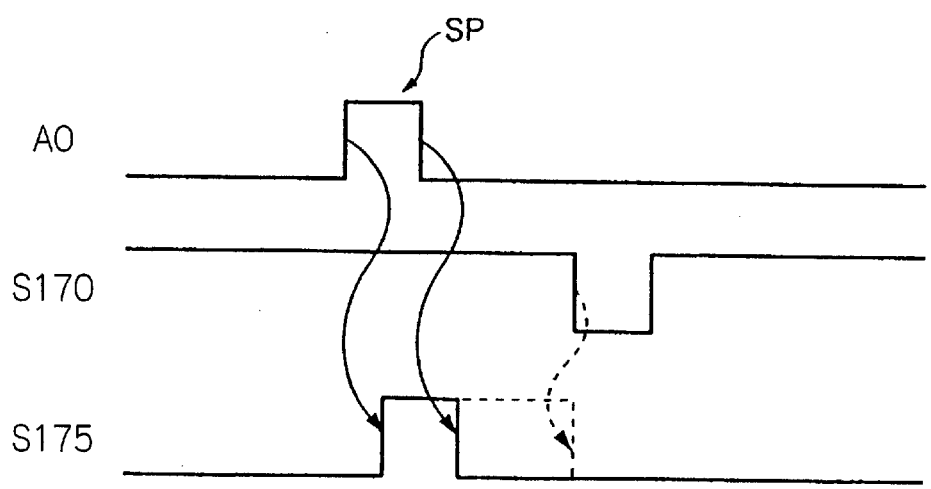
FIG. 24 is a timing chart for explanation of other problem with regard to the background art.

FIG. 18 is a block diagram showing, in a memory address selection signal processing circuit, a structure around the input/output section including the one-shot signal generation circuit according to this invention In this figure, the reference symbol 1-0 denotes an address buffer 0, 1-1 denotes an address buffer 1, 1-X denotes an address buffer X, and these are for internal input of external address 0-address X.

The reference symbol 2-0 denotes a latch 0, 2-1 is a latch 1, and 2-X is a latch X, and latching of address data which has been input by the address buffers is performed with these latches. The address data which has been latched selects an address of a memory cell via an address decoder or the like (not shown in the figure). This latch remains in the through state in the state in which change of the address does not occur.

Furthermore, the reference symbol 3 denotes an address transition detection circuit, and it detects transition of address signals output from the latches and outputs an ATD signal in pulse form. This address transition detection circuit detects transition for each of the addresses and generates ATD signals, and combines these ATD signals from each address which it has generated by logical ORing into a single ATD signal, which it outputs. This address transition detection circuit detects address change, and generates a pulse having a width of the necessary minimum limit not to be undesirably deformed when passing each CMOS gate circuit at later stages.

The reference symbol 4 denotes a one-shot signal generation circuit according to the present invention, and it generates the one-shot signal LC as the latch signal in response to the output of the address transition detection circuit (ATD) and drives the latches. In order to prevent erroneous operation due to the OR circuit generating pulses in the event that there is noise carried in the input address or the like, the one-shot signal LC latches the input address when the skew period of the entire address has elapsed from when the earliest address has been changed, and releases the latch at the time that the internal operation is completed to enter the next operation.

This one-shot signal generation circuit 4 is made up from the timing determination sections 100 and 110 and an LC generation circuit 14 shown in the FIG. 10. The start edge of the one-shot signal LC is determined by the signal PG which is output from the timing determination section 110, and its end edge is determined by the signal DST which is output from the timing determination section 100. In this case, if the timing of the signal PG which is output from the timing determination section 110 is set after the skew period of the address signal has elapsed, the skew period is masked, and erroneous latching of the address signal is prevented.

Although the operation of embodiments of the present invention has been described in detail with reference to the figures, the present invention is not limited to these embodiments, and, even if variations in implementation are present, this is included within the scope of the present invention, provided that there is no departure from the gist of the present invention.

INDUSTRIAL APPLICABILITY

By providing a ring oscillator and a plurality of frequency division circuits which are connected as a cascade and the like, a one-shot signal generation circuit is provided which makes it easy to adjust the pulse width and to deal with variation of the skew of the ATD signal, and moreover which can generate a one-shot signal stably.

What is claimed is:

1. A one-shot signal generation circuit which generates a one-shot signal in response to change of an input signal, comprising:
   a signal transition detection section which detects transition of the input signal and generates a pulse signal;
   a timing determination section which comprises: a start timing determination section which detects a start edge of the pulse signal which is output from the signal transition detection section, starts a count in response to the start edge as a trigger, and generates a signal which determines the timing of a start edge of the one-shot signal based upon the count value; and an end timing determination section which detects an end edge of the pulse signal which is output from the signal transition detection section, starts a count in response to the end edge as a trigger, and generates a signal which determines the timing of an end edge of the one-shot signal based upon the count value; and
   a signal generation section which generates a one-shot signal having edges whose timing is determined by the timing determination section.

2. A one-shot signal generation circuit as described in claim 1, wherein the signal transition detection section comprises:
   a plurality of address transition detection circuits which detect transition of a plurality of address signals as the input signal; and
   a logic gate which combines pulse signals which are respectively output from the plurality of address transition detection circuits into a single signal.

3. A one-shot signal generation circuit as described in claim 1, wherein the end timing determination section comprises:
   a first activation circuit which generates a first activation signal that is activated by the start edge of the pulse signal and is deactivated by the signal which determines the timing of the end edge of the one-shot signal; and
   a first signal generation circuit which is put into the operational state by the first activation signal, counts a first predetermined time in response to the end edge of the pulse signal as a trigger, and generates the signal which determines the timing of the end edge of the one-shot signal.

4. A one-shot signal generation circuit as described in claim 3, wherein the first activation circuit comprises:
   a flip-flop which maintains a state corresponding to the first activation signal;
   a circuit which sets the flip-flop to a setting state which is different from the initial state in response to the pulse signal; and
   a circuit which returns the state of the flip-flop to the initial state in response to the activation of the signal which determines the timing of the end edge of the one-shot signal, and
   wherein the one-shot signal generation circuit outputs a signal output from the flip-flop as the first activation signal.

5. A one-shot signal generation circuit as described in claim 3, wherein the first signal generation circuit comprises:
   a counter circuit which is reset in response to the pulse signal, performs count operation in the period in which the pulse signal is not generated and the first activation signal is generated, and generates a signal which is delayed by the first predetermined time with respect to the end edge of the pulse signal; and a pulse generation circuit which detects an edge of the signal which is output from the counter circuit and generates a signal which has a predetermined pulse width, and outputs this signal as the signal which determines the timing of the end edge of the one-shot signal.

6. A one-shot signal generation circuit as described in claim 5, wherein the counter circuit comprises:

a ring oscillator which is activated in the period in which the pulse signal is not generated and the first activation signal is generated and outputs a clock signal; and a frequency division circuit which is reset in response to the pulse signal, and frequency divides the clock signal which is output from the ring oscillator and generates a signal which is delayed by the first predetermined time.

7. A one-shot signal generation circuit as described in claim 1, wherein the start timing determination section comprises:

a second activation circuit which generates a second activation signal that is activated by the start edge of the pulse signal and is deactivated by the signal which determines the timing of the start edge of the one-shot signal; and a second signal generation circuit which is put into the operational state by the second activation signal, counts a second predetermined time in response to the start edge of the pulse signal as a trigger, and generates the signal which determines the timing of the start edge of the one-shot signal.

8. A one-shot signal generation circuit as described in claim 7, wherein the second activation circuit comprises:

a flip-flop which maintains a state corresponding to the second activation signal;

a circuit which sets the flip-flop to a setting state which is different from the initial state in response to the pulse signal; and a circuit which returns the state of the flip-flop to the initial state in response to the activation of the signal which determines the timing of the start edge of the one-shot signal, and wherein the one-shot signal generation circuit outputs a signal output from the flip-flop as the second activation signal.

9. A one-shot signal generation circuit as described in claim 7, wherein the second signal generation circuit comprises:

a counter circuit which is reset in the period in which the pulse signal is generated and the second activation signal is not generated, performs count operation in the period in which the second activation signal is generated, and generates a signal which is delayed by the second predetermined time with respect to the start edge of the pulse signal; and a pulse generation circuit which detects an edge of the signal which is output from the counter circuit and generates a signal which has a predetermined pulse width, and outputs this signal as the signal which determines the timing of the start edge of the one-shot signal.

10. A one-shot signal generation circuit as described in claim 9, wherein the counter circuit comprises:

a ring oscillator which is activated in the period in which the second activation signal is generated and outputs a clock signal;

a circuit which generates a reset signal in the period in which the pulse signal is generated and the second activation signal is not generated; and a frequency division circuit which is reset in response to the reset signal, and frequency divides the clock signal which is output from the ring oscillator and generates a signal which is delayed by the second predetermined time.

11. A one-shot signal generation circuit as described in claim 1, wherein the signal generation section comprises:

a flip-flop which maintains a state corresponding to the one-shot signal;

a circuit which sets the flip-flop to a setting state which is different from the initial state in response to the activation of the signal which determines the timing of the start edge of the one-shot signal; and a circuit which returns the flip-flop to the initial state in response to the activation of the signal which determines the timing of the end edge of the one-shot signal.

* * * * *